United States Patent
Won et al.

(10) Patent No.: US 12,191,763 B2
(45) Date of Patent: Jan. 7, 2025

(54) SEMICONDUCTOR DEVICE

(71) Applicant: Samsung Electronics Co., Ltd., Suwon-si (KR)

(72) Inventors: Sanggyeong Won, Suwon-si (KR); Hyunjin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 173 days.

(21) Appl. No.: 18/097,226

(22) Filed: Jan. 14, 2023

(65) Prior Publication Data
US 2023/0396160 A1 Dec. 7, 2023

(30) Foreign Application Priority Data
Jun. 2, 2022 (KR) .................. 10-2022-0067587

(51) Int. Cl.
*G11C 5/14* (2006.01)
*G11C 16/08* (2006.01)
*G11C 16/14* (2006.01)
*H02M 3/07* (2006.01)
*G11C 16/30* (2006.01)

(52) U.S. Cl.
CPC .............. *H02M 3/07* (2013.01); *G11C 5/147* (2013.01); *G11C 16/08* (2013.01); *G11C 16/14* (2013.01); *G11C 16/30* (2013.01)

(58) Field of Classification Search
CPC ......... G11C 5/147; G11C 16/08; G11C 16/14; G11C 16/30
See application file for complete search history.

(56) References Cited

U.S. PATENT DOCUMENTS

| 2003/0198114 | A1 | 10/2003 | Fiscus |
| 2006/0071716 | A1 | 4/2006 | Fang et al. |
| 2008/0218253 | A1 | 9/2008 | Pietri et al. |
| 2008/0238518 | A1 | 10/2008 | Guo et al. |
| 2009/0243704 | A1* | 10/2009 | Kang .............. G11C 5/145 327/541 |
| 2012/0155168 | A1* | 6/2012 | Kim ................ G11C 5/14 365/185.23 |
| 2013/0214853 | A1 | 8/2013 | Lin et al. |
| 2020/0044564 | A1 | 2/2020 | Shin |
| 2020/0118632 | A1 | 4/2020 | Tran et al. |

\* cited by examiner

*Primary Examiner* — Han Yang
(74) *Attorney, Agent, or Firm* — Muir Patent Law, PLLC

(57) ABSTRACT

A semiconductor device includes a plurality of memory cells, and a peripheral circuit configured to control the plurality of memory cells. The peripheral circuit includes a temperature compensation circuit configured to output a compensation current determined based on a temperature of the semiconductor device, a voltage regulator configured to regulate a pump voltage having a level determined based on the compensation current, a clock generator configured to generate a clock signal having a frequency determined based on the compensation current; and a charge pump circuit including a level shifter, configured to output a control signal adjusted a swing level of the control signal based on the clock signal and the pump voltage, and a plurality of unit circuits, each of the plurality of unit circuits including a plurality of pumping capacitors configured to be charged and discharged by the control signal.

20 Claims, 20 Drawing Sheets

SEMICONDUCTOR DEVICE

CROSS-REFERENCE TO RELATED APPLICATION(S)

This application claims benefit of priority to Korean Patent Application No. 10-2022-0067587 filed on Jun. 2, 2022 in the Korean Intellectual Property Office, the disclosure of which is incorporated herein by reference in its entirety.

BACKGROUND

The present disclosure relates to a semiconductor device.

A semiconductor device may include a voltage generator generating a power supply voltage used for an operation thereof using an external power supply voltage supplied by an external host, or the like. For example, the voltage generator may output a high voltage having a level higher than a level of the external power supply voltage. The voltage generator may include a charge pump to generate the high voltage having a level higher than the level of the external power supply voltage. The charge pump may occupy a relatively large area, as compared with other circuits included in such a semiconductor device. Accordingly, the charge pump needs to be effectively designed to improve the degree of integration of the semiconductor device.

SUMMARY

Example embodiments provide a semiconductor device having increased integration density achieved by effectively designing a charge pump and improved reliability achieved by implementing a charge pump such that a level of an output voltage of a charge pump is determined to vary depending on a change in temperature.

According to an example embodiment, a semiconductor device includes a plurality of memory cells, and a peripheral circuit configured to control the plurality of memory cells. The peripheral circuit includes a temperature compensation circuit configured to output a compensation current determined based on a temperature of the semiconductor device, a voltage regulator configured to regulate a pump voltage having a level determined based on the compensation current, a clock generator configured to generate a clock signal having a frequency determined based on the compensation current, and a charge pump circuit including a level shifter, configured to output a control signal adjusted a swing level of the control signal based on the clock signal and the pump voltage, and a plurality of unit circuits, each of the plurality of unit circuits including a plurality of pumping capacitors configured to be charged and discharged by the control signal.

According to an example embodiment, a semiconductor device includes a temperature compensation circuit configured to output a proportional-to-absolute temperature (PTAT) current determined based on a temperature of the semiconductor device as a compensation current, a voltage regulator configured to output a pump voltage having a level determined based on a compensation current, a clock generator configured to generate a clock signal having a frequency determined based on the compensation current, a level shifter configured to generate a control signal adjusted a swing level of the control signal based on the clock signal and the pump voltage, and a charge pump including a plurality of unit circuits, each of the plurality of unit circuits including a plurality of pumping capacitors configured to be charged and discharged by the control signal. The level shifter is disposed to be closer to the charge pump than the clock generator.

According to an example embodiment, a semiconductor device includes a level shifter configured to receive a first clock signal, a second clock signal having a phase opposite to a phase of the first clock signal, and a pump voltage, output a first control signal and a second control signal based on the first and second clock signals and the pump voltage, and adjust swing levels of the first control signal and the second control signal based on a level of the pump voltage to output a first control signal and a second control signal, and a charge pump including a plurality of unit circuits, each of the plurality of unit circuits including at least one first pumping capacitor, configured to be charged and discharged by the first control signal, and at least one second pumping capacitor configured to be charged and discharged by the second control signal. At least one of a frequency and a swing level of each of the first control signal and the second control signal is increased as a temperature of the semiconductor device is increased. The level of the pump voltage may be determined based on the temperature.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
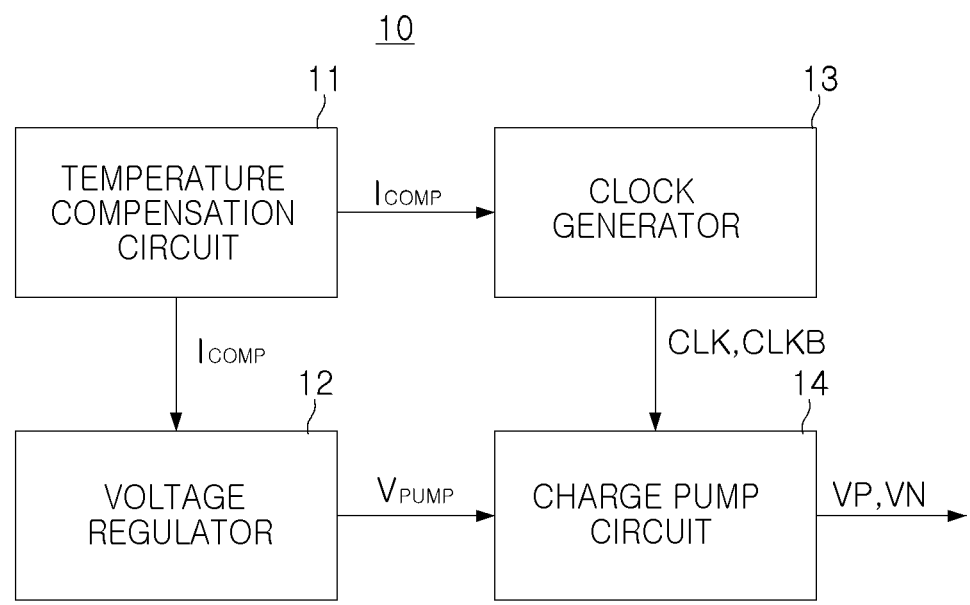
FIGS. 1 and 2 are schematic block diagrams illustrating semiconductor devices according to example embodiments.
Figure 2:
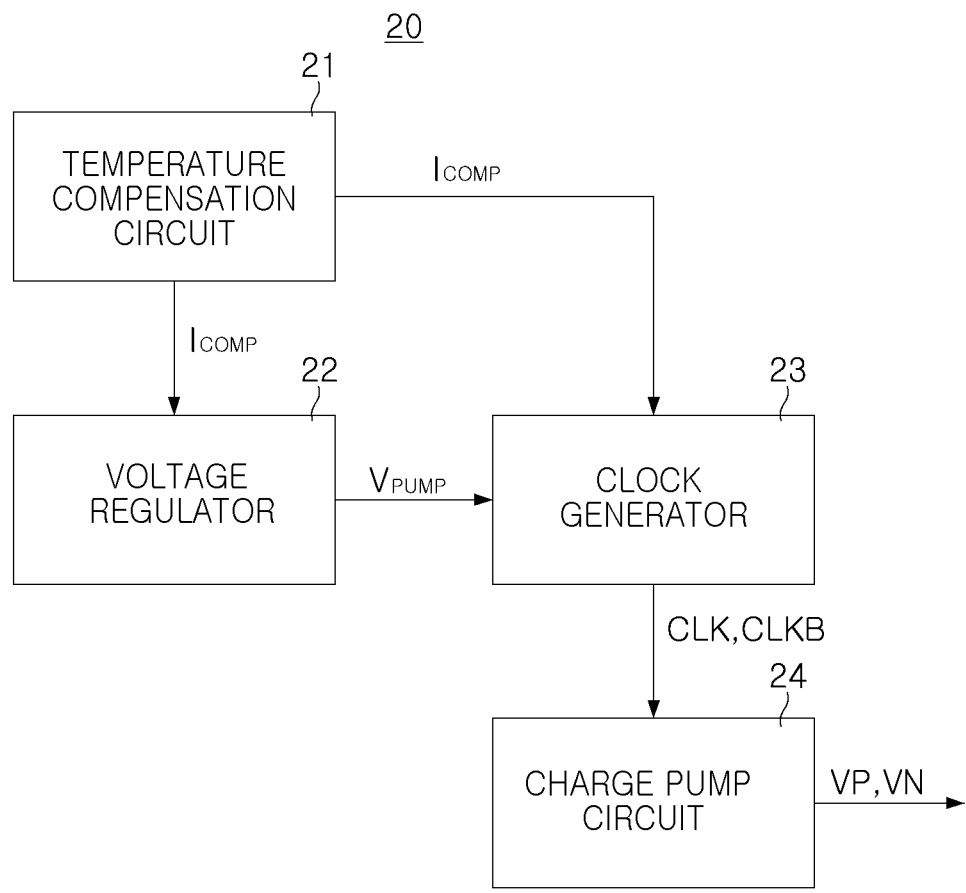

FIGS. 1 and 2 are schematic block diagrams illustrating semiconductor devices according to example embodiments.

Referring first to FIG. 1, a semiconductor device 10 according to an example embodiment may include a temperature compensation circuit 11, a voltage regulator 12, a clock generator 13, a charge pump circuit or a charge pump 14, and the like. The temperature compensation circuit 11 may output a compensation current $I_{COMP}$ having a magnitude varying based on an internal and/or ambient temperature of the semiconductor device 10. For example, the temperature compensation circuit 11 may include a proportional-to-absolute temperature (PTAT) circuit increasing and outputting compensation current $I_{COMP}$ as a temperature is increased.

The voltage regulator 12 may output a pump voltage $V_{PUMP}$ having a level determined by the compensation current Icon. For example, the level of the pump voltage $V_{PUMP}$ output from the voltage regulator 12 may be increased as the magnitude of the compensation current Icon is increased. In this case, the level of the pump voltage $V_{PUMP}$ may be increased as the internal and/or ambient temperature of the semiconductor device 10 is increased.

The clock generator 13 may output a first clock signal CLK and a second clock signal CLKB having opposite phases. For example, a frequency of each of the first clock signal CLK and the second clock signal CLKB may vary based on the magnitude of the compensation current $I_{COMP}$. In the example embodiment illustrated in FIG. 1, the frequency of each of the first clock signal CLK and the second clock signal CLKB may be increased as the magnitude of the compensation current $I_{COMP}$ is increased.

The charge pump circuit 14 may output one or more output voltages VP and VN. As an example, the charge pump circuit 14 may include a plurality of pumping capacitors. Each of the plurality of pumping capacitors, included in the charge pump circuit 14, may be charged or discharged by a first control signal corresponding to the first clock signal CLK or a second control signal corresponding to the second clock signal CLKB.

The charge pump circuit 14 may include a level shifter circuit generating a first control signal and a second control signal using the pump voltage $V_{PUMP}$. As an example, the level shifter circuit may increase a voltage level of the first control signal using the pump voltage $V_{PUMP}$ and, similarly, may increase a voltage level of the second control signal using the pump voltage $V_{PUMP}$. In this case, each of the first control signal and the second control signal may have the same frequency as the first clock signal CLK and the second clock signal CLKB, and may swing the first control signal and the second control signal to a voltage level higher than a level of each of the first clock signal CLK and the second clock signal CLKB.

As an example, the charge pump circuit 14 may generate a positive voltage VP and a negative voltage VN. The positive voltage VP may have a level higher than a level of a ground voltage, and may be generated by a positive charge pump included in the charge pump circuit 14. The negative voltage VN may have a level lower than the level of the ground voltage, and may be generated by a negative charge pump included in the charge pump circuit 14. According to an example embodiment, the charge pump circuit 14 may generate at least one of the positive voltage VP and the negative voltage VN as a plurality of voltages having different voltage levels.

Referring to FIG. 2, a semiconductor device 20 according to an example embodiment may include a temperature compensation circuit 21, a voltage regulator 22, a clock generator 23, and a charge pump circuit or a charge pump 24. The temperature compensation circuit 21 may output a compensation current Icon having a magnitude varying based on an internal and/or ambient temperature of the semiconductor device 20. The voltage regulator 22 may generate and output the pump voltage $V_{PUMP}$ having a level determined by the compensation current $I_{COMP}$.

In the example embodiment illustrated in FIG. 2, the clock generator 23 may receive the compensation current $I_{COMP}$ and a pump voltage $V_{PUMP}$. As an example, the clock generator 23 may determine frequencies of clock signals CLK and CLKB based on the magnitude of the compensation current Icon, and may determine swing levels of the clock signals CLK and CLKB based on the level of the pump voltage $V_{PUMP}$. For example, the clock generator 23 may generate clock signals CLK and CLKB, having frequencies and swing levels determined based on the compensation current Icon and the pump voltage $V_{PUMP}$, and may output the generated clock signals CLK and CLKB to the charge pump circuit 24.

The charge pump circuit 24 may include charge pumps generating a positive voltage VP and a negative voltage VN, and the clock signals CLK and CLKB may be input to each of the charge pumps. As an example, a plurality of pumping capacitors included in each of the charge pumps may be charged and discharged by the clock signals CLK and CLKB. In the example embodiment illustrated in FIG. 2, the clock generator 23 outputs clock signals CLK and CLKB having the swing levels determined based on the level of the pump voltage $V_{PUMP}$, so that an additional level shifter circuit may not be included the charge pump circuit 24.

Figure 3:
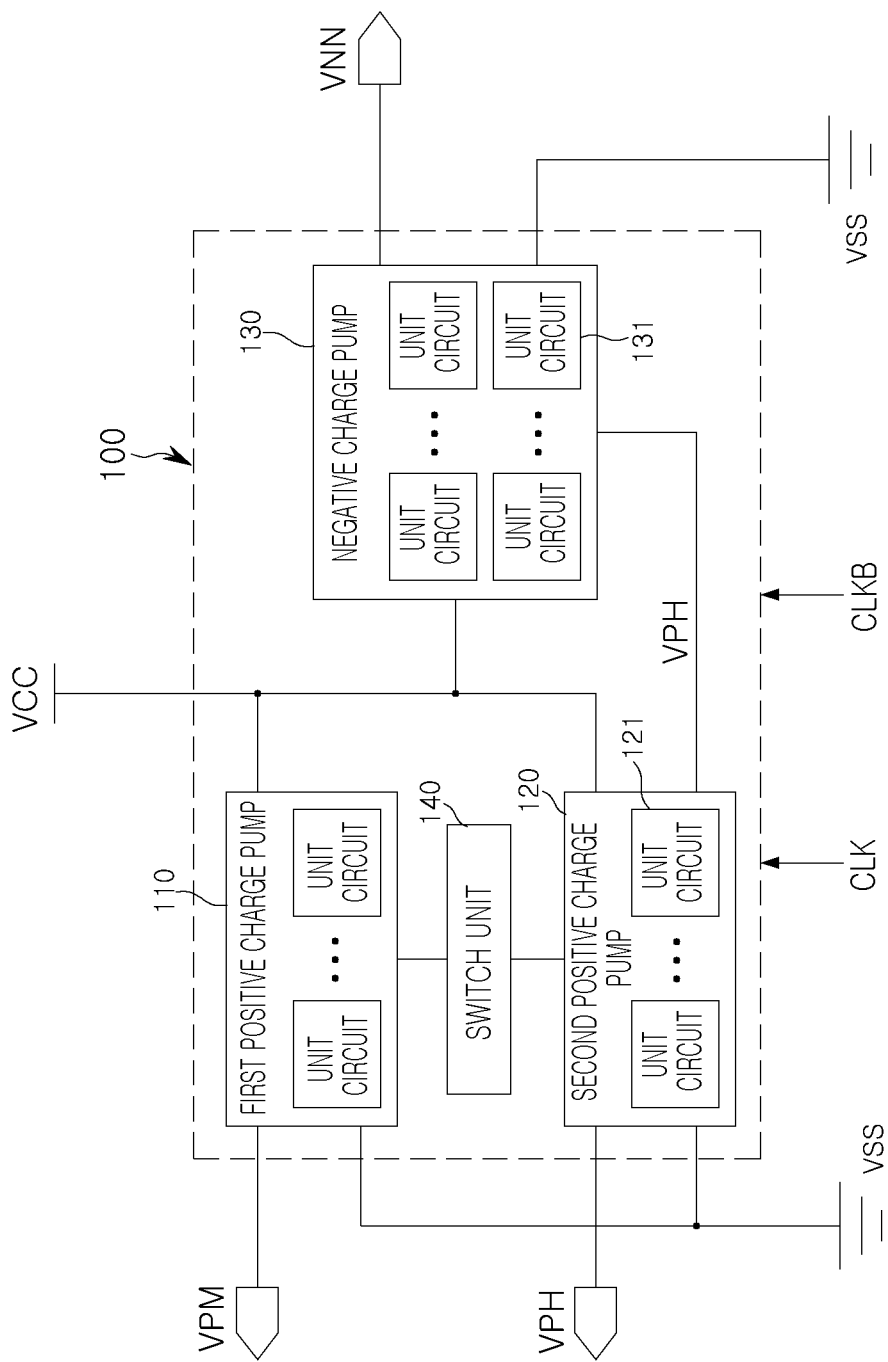
FIG. 3 is a schematic block diagram illustrating a charge pump included in a semiconductor device according to an example embodiment.

FIG. 3 is a schematic block diagram illustrating a charge pump included in a semiconductor device according to an example embodiment.

Referring to FIG. 3, a charge pump 100 according to an example embodiment may include a first positive charge pump 110, a second positive charge pump 120, a negative charge pump 130, a switch unit 140, and the like. Each of the first positive charge pump 110, the second positive charge pump 120, and the negative charge pump 130 may include a plurality of unit circuits 111, 121, and 131. The charge pump 100 may receive a first clock signal CLK and a second clock signal CLKB, and output a first positive voltage VPM, a second positive voltage VPH, and a negative voltage VNN. The charge pump 100 may correspond to the charge pump circuit 14 of FIG. 1 or the charge pump circuit 24 of FIG. 2.

Each of the plurality of unit circuits 111, 121, and 131 may include a plurality of pumping capacitors. Among the plurality of pumping capacitors, some pumping capacitors may be charged and discharged by a first control signal CTR1, and the other pumping capacitors may be charged and discharged by a second control signal CTR2. The first control signal CTR1 and the second control signal CTR2 may have opposite phases. The first control signal CTR1 and the second control signal CTR2 may be generated from a level shifter (not shown) included in the charge pump 100 in response to the first and second clock signals CLK and CLKB. The first clock signal CLK and the second clock signal CLKB may have opposite phases.

Each of the first positive charge pump 110, the second positive charge pump 120, and the negative charge pump 130 may receive a first power supply voltage VCC and a second power supply voltage VSS, and may generate a predetermined output voltage. As an example, the first positive charge pump 110 may output the first positive voltage VPM, and the second positive charge pump 120 may output the second positive voltage VPH. The negative charge pump 130 may output the negative voltage VNN. The negative voltage VNN may be lower than the second power supply voltage VSS, and the second positive voltage VPH may be higher than the first positive voltage VPM. The switching unit 140 may connect the first positive charge pump 110 and the second positive charge pump 120 to each other in series, such that the second positive charge plump 120 generates the second positive voltage VPH.

In the example embodiment illustrated in FIG. 3, the number of unit circuits 111 included in the first positive charge pump 110 may be the same as the number of unit circuits 121 included in the second positive charge pump 120. In addition, the number of unit circuits 111 included in the first positive charge pump 110 may be smaller than the number of unit circuits 131 included in the negative charge pump 130. At least a portion of the unit circuits 131 included in the negative charge pump 130 may receive the second positive voltage VPH output from the second positive charge pump 120, and generate the negative voltage VNN.

In example embodiments, the level shifter of the charge pump 100 may receive a pump voltage $V_{PUMP}$ from a voltage regulator to generate the first control signal CTR1 and the second control signal CTR2. For example, the voltage regulator may output the pump voltage $V_{PUMP}$ based on the compensation current $I_{COMP}$.

Figure 4:
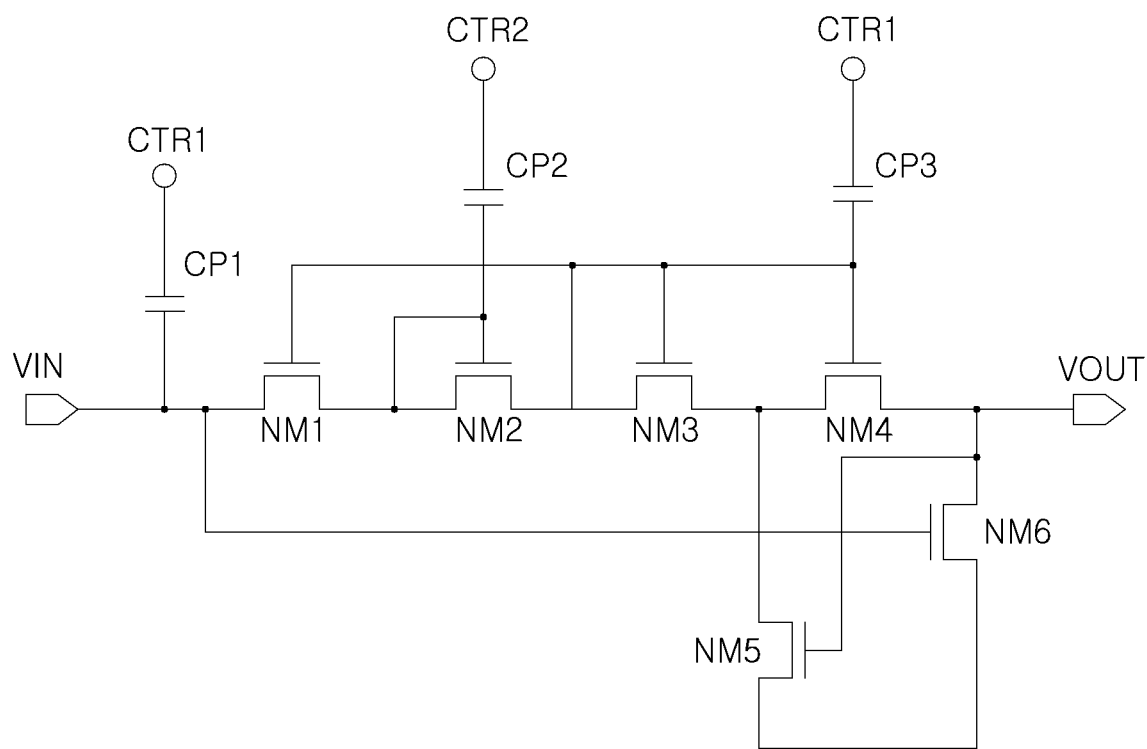
FIGS. 4 to 6 are schematic circuit diagrams illustrating charge pumps included in a semiconductor device according to example embodiments.
Figure 5:
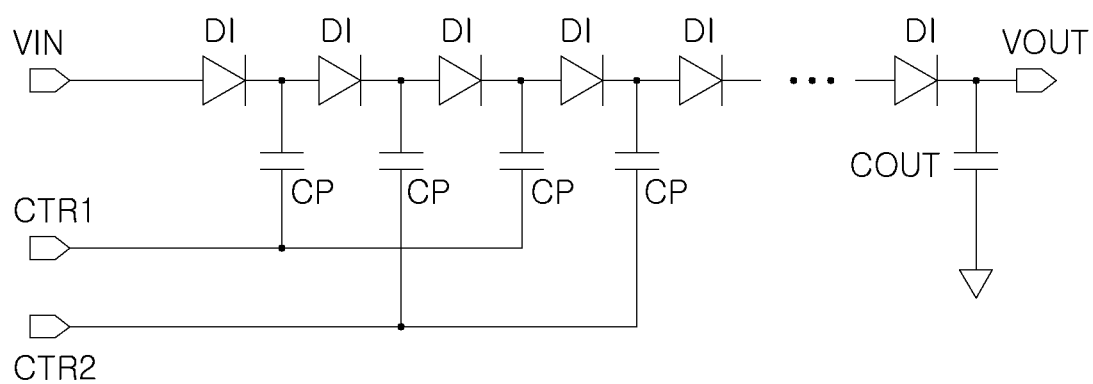
Figure 6:
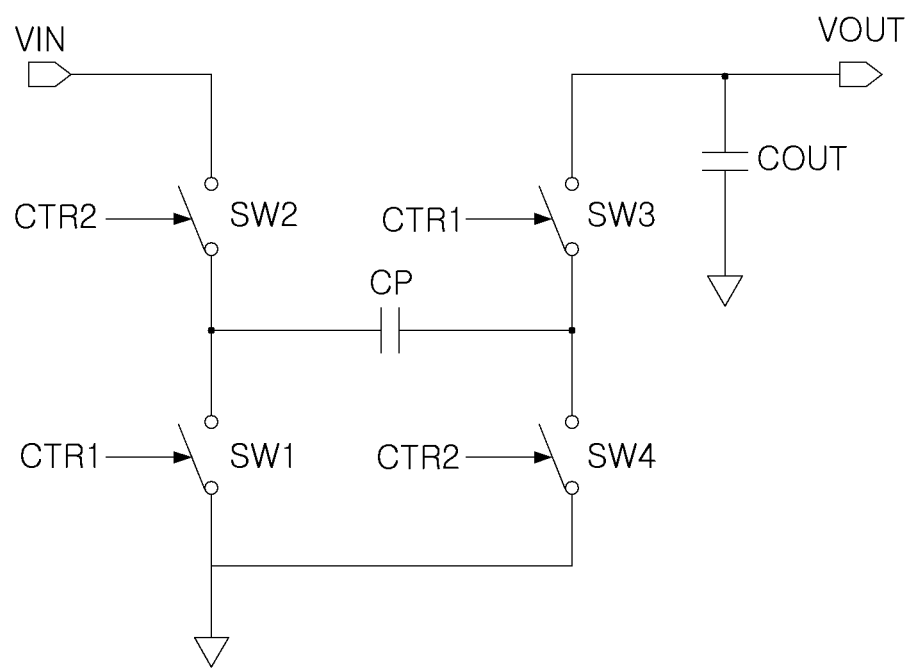

FIGS. 4 to 6 are schematic circuit diagrams illustrating charge pumps included in a semiconductor device according to example embodiments.

FIGS. 4 to 6 may be schematic circuit diagrams illustrating unit circuits included in a charge pump. Referring to FIG. 4, a unit circuit 200 included in the charge pump may include a plurality of pumping capacitors CP1 to CP3 and a plurality of transistors NM1 to NM6. The charge pump may amplify an input voltage VIN to generate an output voltage VOUT. For example, the input voltage VIN may be the first power supply voltage VCC. As an example, a ratio of the output voltage VOUT to the input voltage VIN may vary based on capacitance of each of the plurality of pumping capacitors CP1 to CP3 and characteristics of control signals CTR1 and CTR2 input to the plurality of pumping capacitors CP1 to CP3. In an embodiment, the first and second clock signals CLK and CLKB may be input to the plurality of pumping capacitors CP1 to CP3 instead of the control signals CTR1 and CTR2. Each of the plurality of pumping capacitors CP1 to CP3 may be implemented as a metal-oxide-semiconductor (MOS) capacitor.

The control signals CTR1 and CTR2 may have opposite phases. A frequency and a swing level of the first control signal CTR1 may be the same as those of the second control signal CTR2. The ratio of the output voltage VOUT and the input voltage VIN may vary based on the frequency and the swing level of the control signals CTR1 and CTR2. As an example, a level of the output voltage VOUT may be increased as the frequency and/or the swing level of the control signals CTR1 and CTR2 is increased.

Among the plurality of pumping capacitors CP1 to CP3, the first pumping capacitor CP1 and the third pumping capacitor CP3 may be charged and discharged by the first control signal CTR1, and the second pumping capacitor CP2 may be charged and discharged by the control signal CTR2. In another unit circuit connected, in series, to the unit circuit 200 illustrated in FIG. 4, the first pumping capacitor CP1 and the third pumping capacitor CP3 may be charged and discharged by the second control signal CTR2, and the second pumping capacitor CP2 may be charged and discharged by the first control signal CTR1.

The charge pump may include a plurality of unit circuits described with reference to FIG. 4. In the charge pump, at least a portion of the plurality of unit circuits may be connected to each other in series to generate a high-level output voltage VOUT. As an example, a first unit circuit and a second unit circuit may be connected to each other in series, and an output voltage VOUT of the first unit circuit may be input to the second unit circuit as an input voltage VIN.

In this case, as described above, in the first unit circuit, the first and third pumping capacitors CP1 and CP3 may be charged and discharged by a first control signal, and the second pumping capacitor CP2 may be charged and discharged by a second control signal. On the other hand, in the second unit circuit, the first and third pumping capacitors CP1 and CP3 may be charged and discharged by the second control signal, and the second pumping capacitor CP2 may be charged and discharged by the first control signal. Accordingly, in the first unit circuit, the number of pumping capacitors charged and discharged by the first control signal may be greater than the number of pumping capacitors charged and discharged by the second control signal. Meanwhile, in the second unit circuit, the number of pumping capacitors charged and discharged by the first control signal may be smaller than the number of pumping capacitors charged and discharged by the second control signal.

Referring to FIG. 5, a unit circuit 210 included in the charge pump according to an example embodiment may include a plurality of diodes DI, a plurality of pumping capacitors CP, an output capacitor COUT, and the like. The plurality of diodes DI may be connected to each other in series, and the plurality of pumping capacitors CP may be connected to a node between the plurality of diodes DI. A first diode may receive an input voltage VIN having a predetermined level, and the last diode may output an output voltage VOUT to an output node. For example, the input voltage VIN may be the first power supply voltage VCC.

Each of the plurality of pumping capacitors CP may be charged and discharged by a first control signal CTR1 or a second control signal CTR2. In this case, the first and second control signals CTR1 and CTR2 have opposite phases. As an example, in the example embodiment illustrated in FIG. 5, odd pumping capacitors CP may be charged or discharged by the first control signal CTR1, and even pumping capacitors CP may be charged or discharged by the second control signal CTR2. In an embodiment, the first and second clock signals CLK and CLKB may be input to the plurality of pumping capacitors CP instead of the control signals CTR1 and CTR2.

The unit circuit 210 according to the example embodiment illustrated in FIG. 5 may be a unit circuit included in the positive charge pump. In the unit circuit included in the negative charge pump, the diodes DI may be connected to each other in a direction, opposite to that in the example embodiment illustrated in FIG. 5.

Referring to FIG. 6, a unit circuit 220 included in the charge pump according to an example embodiment may include a plurality of switching elements SW1 to SW4, at least one pumping capacitor CP, an output capacitor COUT, and the like. Among the plurality of switching elements SW1 to SW4, the second switching element SW2 may receive an input voltage VIN, and the first switching element SW1 and the fourth switching element SW4 may be connected to a node to which a ground voltage, or the like, is supplied. The third switching element SW3 may be connected between an output node and the pumping capacitor CP. For example, the input voltage VIN may be the first power supply voltage VCC.

The first switching element SW1 and the third switching element SW3 may be turned on and off by a first control signal CTR1, and the second switching element SW2 and the fourth switching element SW4 may be turned on and off by a second control signal CTR2, a complementary signal of the first control signal CTR1. When the second switching element SW2 and the fourth switching element SW4 are turned on, electrical charges may be charged into the pumping capacitor CP by a power supply voltage VCC. When the first switching element SW1 and the third switching element SW3 are turned on, the electrical charges charged into the pumping capacitor CP may be shared with the output capacitor COUT, and the output voltage VOUT may be output through the output node. In an embodiment, the first and second clock signals CLK and CLKB may be input to a corresponding switching element instead of the control signals CTR1 and CTR2.

In an example embodiment, at least one of a frequency and a swing level of each of the first control signal CTR1 and the second control signal CTR2, input to the unit circuits 200, 210, and 220, may vary based on the internal and/or ambient temperature of a semiconductor device including a charge pump. As an example, when the internal and/or ambient temperature of a semiconductor device is room temperature or lower, the frequency and the swing level of each of the first control signal CTR1 and the second control signal CTR2 may be maintained at default values. On the other hand, when the internal and/or ambient temperature of the semiconductor device is increased, the frequency and/or the swing level of each of the first control signal CTR1 and the second control signal CTR2 may be increased.

Accordingly, a level of a voltage output by the charge pump may be increased in a high-temperature environment in which an effect of leakage current is significant, and a stable operation of the semiconductor device may be secured. In addition, the frequency and the swing level of each of the first control signal CTR1 and the second control signal CTR2 are maintained in an environment at room temperature or lower, such that a voltage having no burden on elements included in the semiconductor device is output from the charge pump, so that the reliability of the semiconductor device may also be improved. Moreover, it is unnecessary to increase capacity of the pumping capacitors included in the unit circuits 200, 210, and 220 to secure the level of the voltage output by the charge pump in a high-temperature environment, so that an area of the charge pump may be reduced to increase the degree of integration of the semiconductor device.

Figure 7:
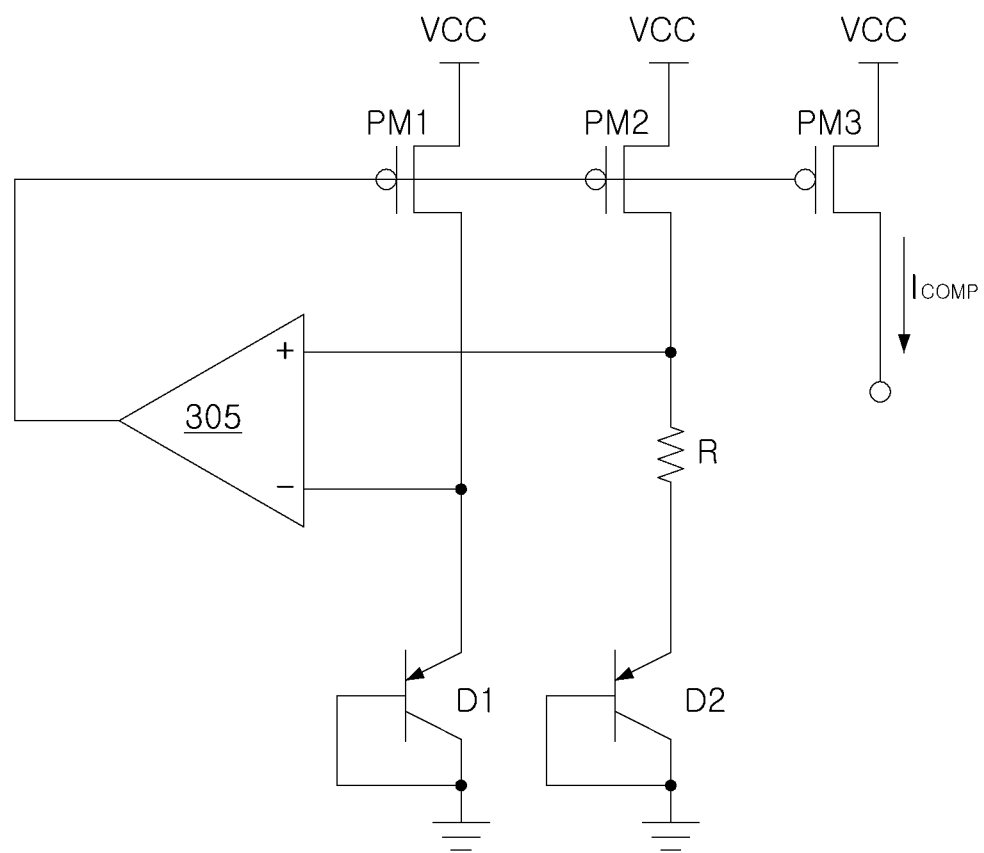
FIG. 7 is a schematic circuit diagram illustrating a temperature compensation circuit included in a semiconductor device according to an example embodiment.

FIG. 7 is a schematic circuit diagram illustrating a temperature compensation circuit included in a semiconductor device according to an example embodiment.

Referring to FIG. 7, a temperature compensation circuit 300 of a semiconductor device according to an example embodiment may include an operational amplifier 305, a plurality of transistors PM1 to PM3, a resistance element R, diodes D1 and D2, and the like. As illustrated in FIG. 7, each of the plurality of transistors PM1 to PM3 may be implemented as a P-type MOS field-effect transistor (MOSFET), and each of the diodes D1 and D2 may be implemented as a bipolar junction transistor. As an example, a size of a bipolar junction transistor providing the diode D2 may be larger than a size of a bipolar junction transistor providing the first diode D1.

Referring to FIG. 7, an inverting input terminal of the operational amplifier 305 may be connected to the first diode D1, and a non-inverting input terminal may be connected to the resistance element R and the second diode D2. In a bipolar junction transistor, a voltage between a base and an emitter may vary based on temperature. As illustrated in FIG. 7, the first diode D1 and the second diode D2 are respectively provided by the bipolar junction transistors having different sizes, so that an output of the operational amplifier 305 and a magnitude of the compensation current Icon flowing through the third transistor PM3 may also vary based on temperature. As an example, the magnitude of the compensation current Icon may be increased as the temperature is increased.

Figure 8:
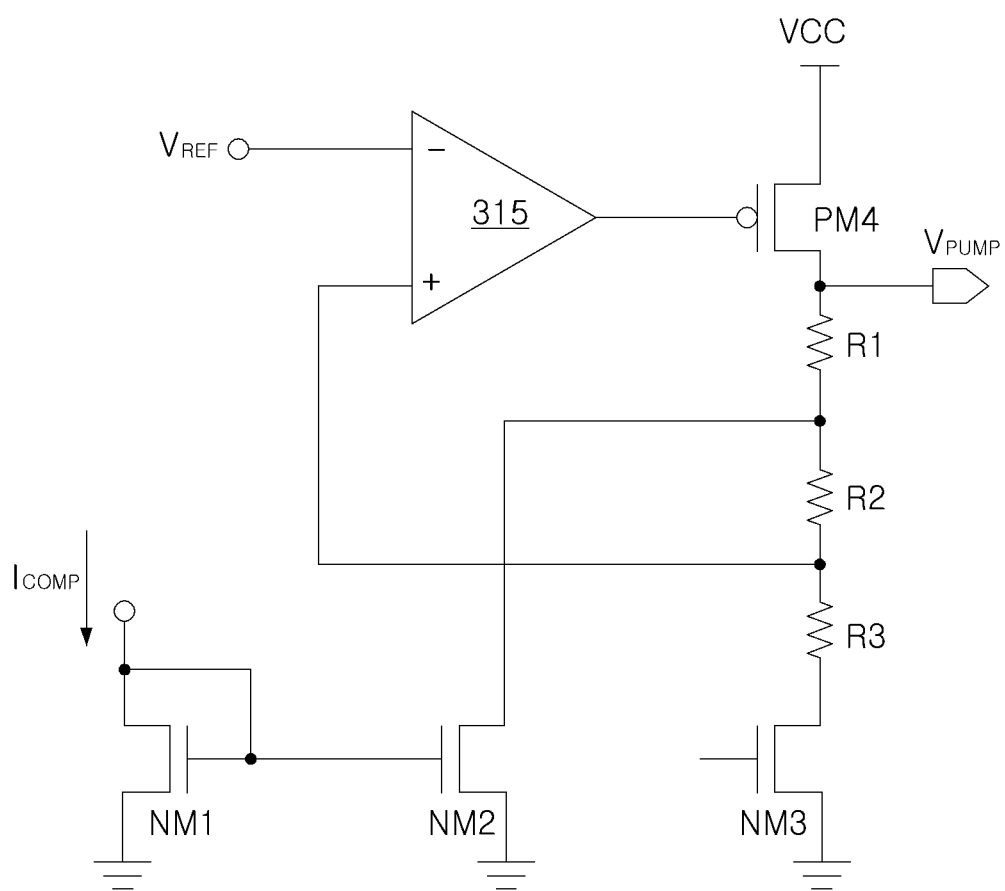
FIG. 8 is a schematic circuit diagram illustrating a voltage regulator included in a semiconductor device according to an example embodiment.

FIG. 8 is a schematic circuit diagram illustrating a voltage regulator included in a semiconductor device according to an example embodiment.

Referring to FIG. 8, the voltage regulator 310 of the semiconductor device according to an example embodiment may include an operational amplifier 315, a plurality of transistors NM1 to NM3 and PM4, a plurality of resistance elements R1 to R3, and the like. Among the plurality of transistors NM1 to NM3 and PM4, each of the first to third transistors NM1 to NM3 may be implemented as an N-type MOSFET, and the fourth transistor PM4 may be implemented as a P-type MOSFET.

The voltage regulator 310 may receive compensation current $I_{COMP}$ from a temperature compensation circuit. As described above with reference to FIG. 7, the magnitude of the compensation current $I_{COMP}$ may be increased in proportion to temperature. The compensation current $I_{COMP}$ may be input to the first transistor NM1, and current obtained by mirroring the compensation current $I_{COMP}$ may flow through the second transistor NM2. Accordingly, a voltage in a node between the first resistance element R1 and the second resistance element R2 may vary based on the magnitude of the compensation current $I_{COMP}$.

A predetermined reference voltage $V_{REF}$ may be input to an inverting input terminal of the operational amplifier 315, and a non-inverting input terminal may be connected to a node between the second resistance element R2 and the third resistance element R3. When the compensation current $I_{COMP}$ is increased, a voltage on the non-inverting input terminal of the operational amplifier 315 may be increased and a level of the pump voltage $V_{PUMP}$ output from the voltage regulator 310 may be increased. For example, the level of the pump voltage $V_{PUMP}$ output from the voltage regulator 310 may vary based on the internal and/or ambient temperature of the semiconductor device including the voltage regulator 310. As an example, the level of the pump voltage $V_{PUMP}$ may be increased as the temperature is increased.

Figure 9:
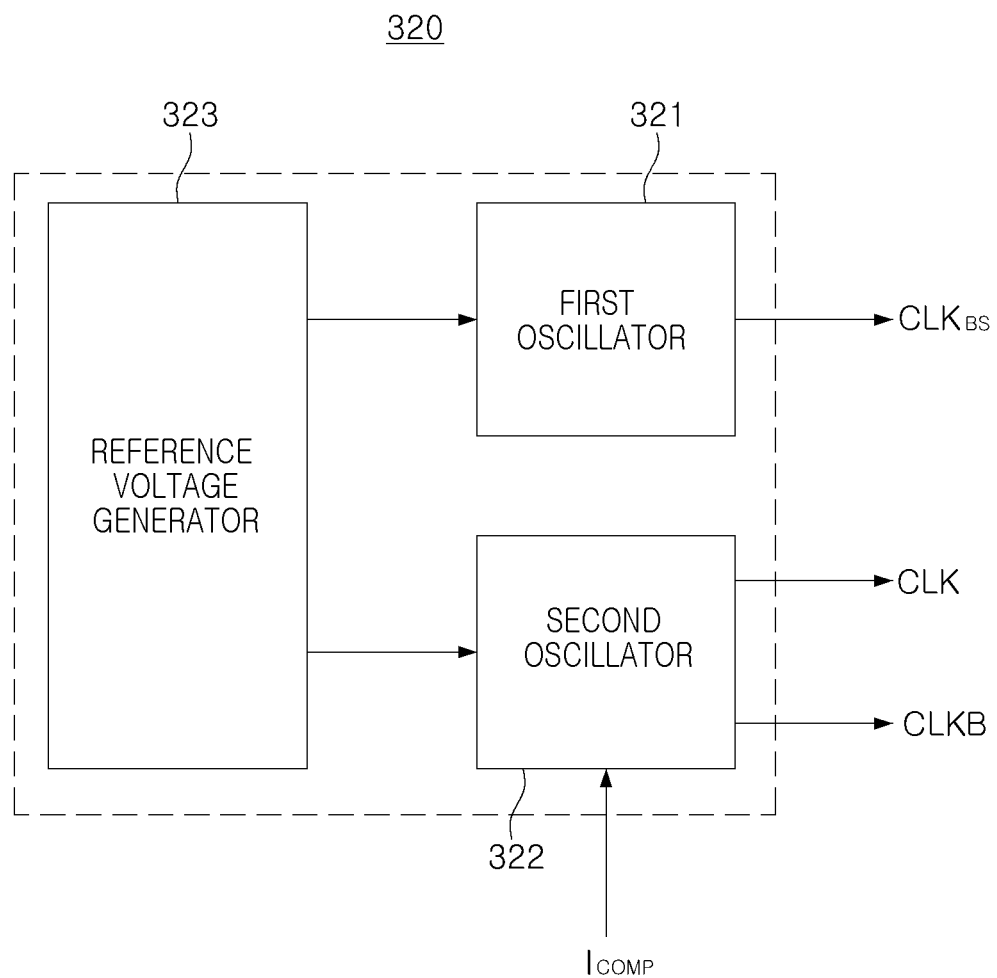
FIG. 9 is a schematic block diagram illustrating a clock generator included in a semiconductor device according to an example embodiment.

FIG. 9 is a schematic block diagram illustrating a clock generator included in a semiconductor device according to an example embodiment.

Referring to FIG. 9, a clock generator 320 according to an example embodiment may include a first oscillator 321, a second oscillator 322, and a reference voltage generator 323. A frequency of a reference clock signal $CLK_{BS}$ output from the first oscillator 321 may be determined by a predetermined reference voltage provided by the reference voltage generator 323. As an example, the frequency of the reference clock signal $CLK_{BS}$ output from the first oscillator 321 may not be affected by the temperature. The reference clock signal $CLK_{BS}$ may be provided as a system clock of an internal circuit of the semiconductor device including the clock generator 320, or the like.

The second oscillator 322 may further receive a compensation current $I_{COMP}$, other than the reference voltage provided by the reference voltage generator 323. As described above, the compensation current $I_{COMP}$ may be current output from the temperature compensation circuit. When the temperature compensation circuit includes a PTAT circuit, magnitude of the compensation current $I_{COMP}$ may be increased in proportion to the internal and/or ambient temperature of the semiconductor device.

The second oscillator 322 may output a first clock signal CLK and a second clock signal CLKB, and the first clock signal CLK and the second clock signal CLKB may have opposite phases. A frequency of each of the first clock signal CLK and the second clock signal CLKB may be determined by the compensation current $I_{COMP}$. As an example, the frequency of each of the first clock signal CLK and the second clock signal CLKB may be increased as the magnitude of the compensation current $I_{COMP}$ is increased.

Accordingly, the frequency of each of the first clock signal CLK and the second clock signal CLKB may be increased as the internal and/or ambient temperature of the semiconductor device is increased. The first clock signal CLK and the second clock signal CLKB may be input to a charge pump circuit, included in the semiconductor device, to charge and discharge pumping capacitors in the charge pump circuit. As the internal and/or ambient temperature of the semiconductor device is increased, the pumping capacitors may be charged and discharged with the first clock signal CLK and the second clock signal CLKB having higher frequencies and a level of an output voltage of the charge pump circuit may be increased.

Figure 10A:
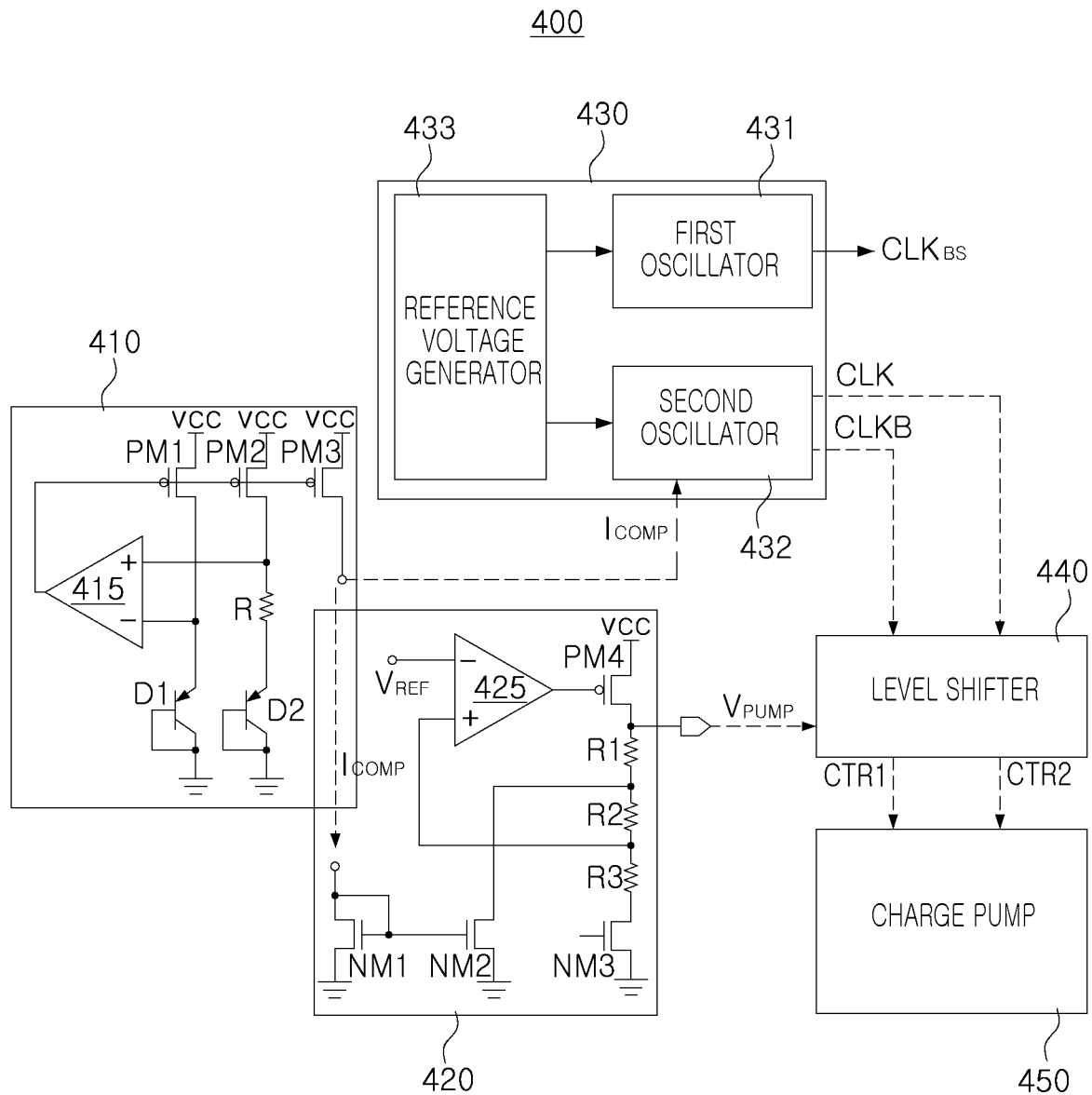
FIGS. 10A and 10B are schematic diagrams illustrating a semiconductor device according to example embodiments.
Figure 10B:
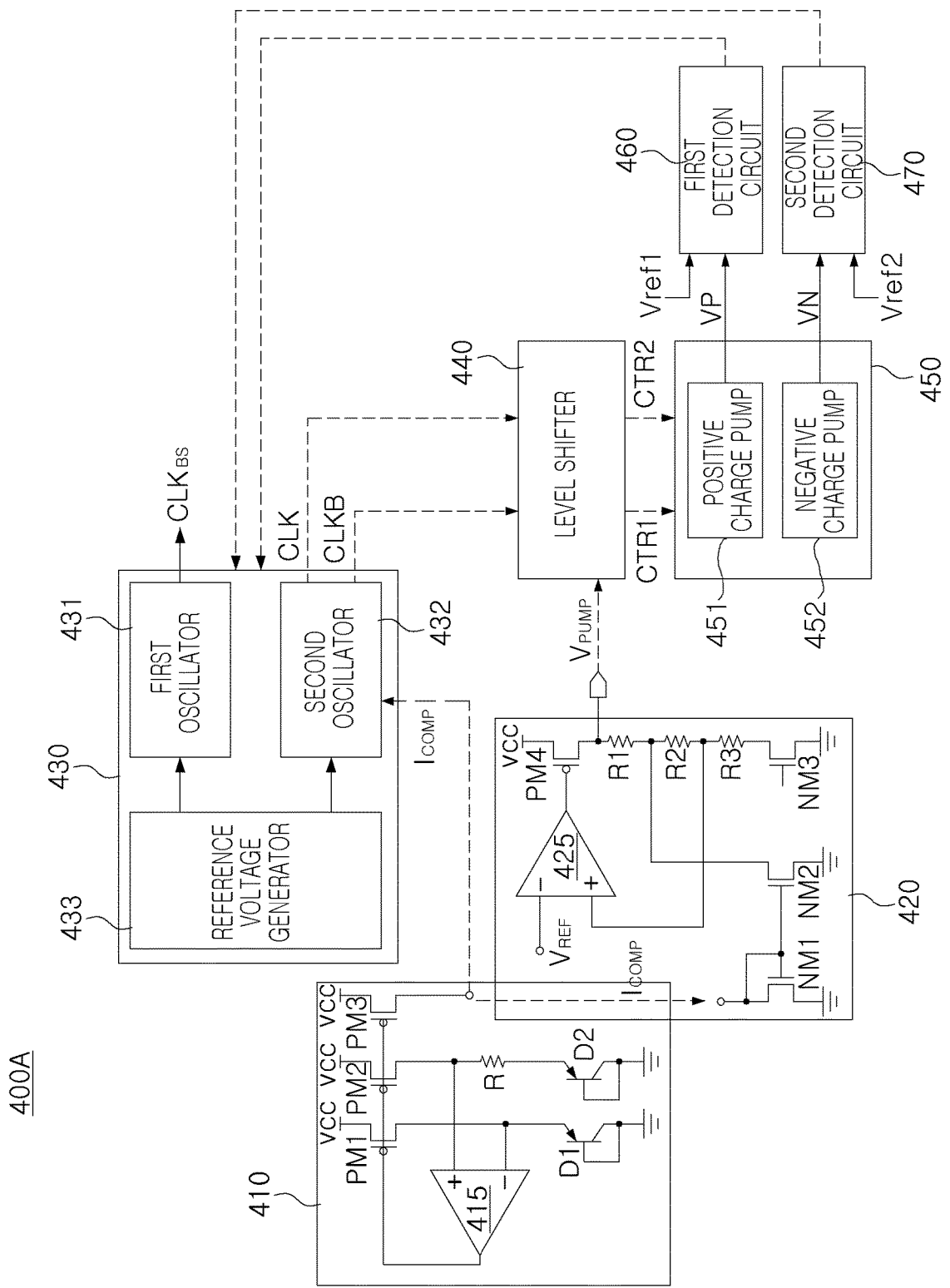
Figure 11:
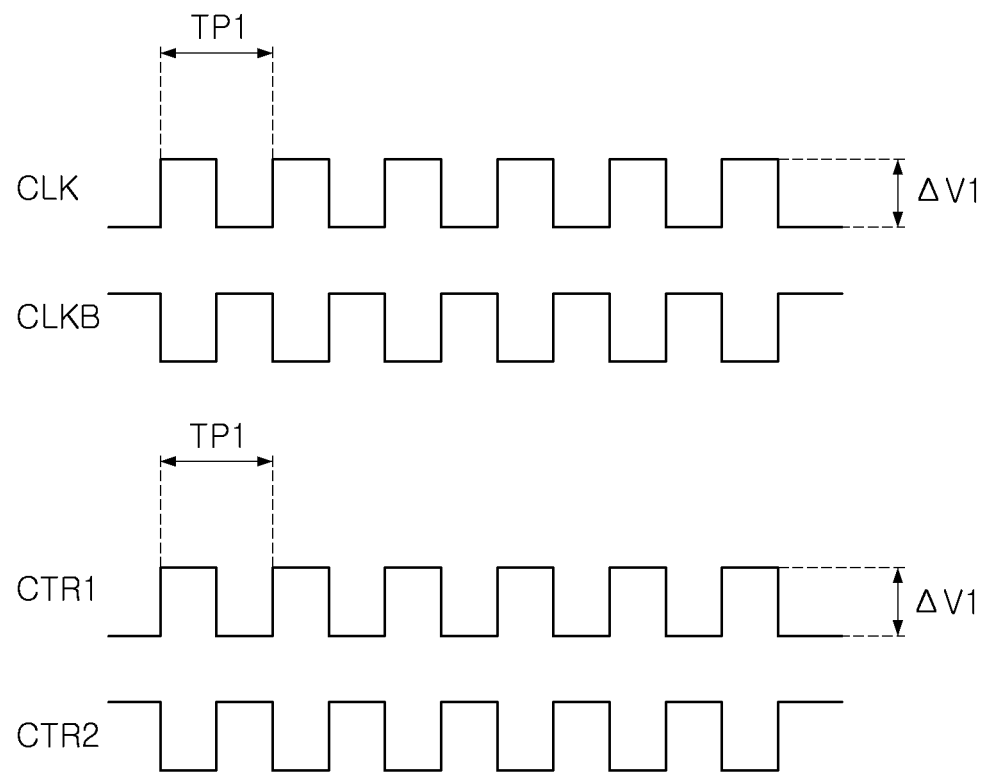
FIGS. 11 and 12 are diagrams illustrating operations of a semiconductor device according to example embodiments.
Figure 12:
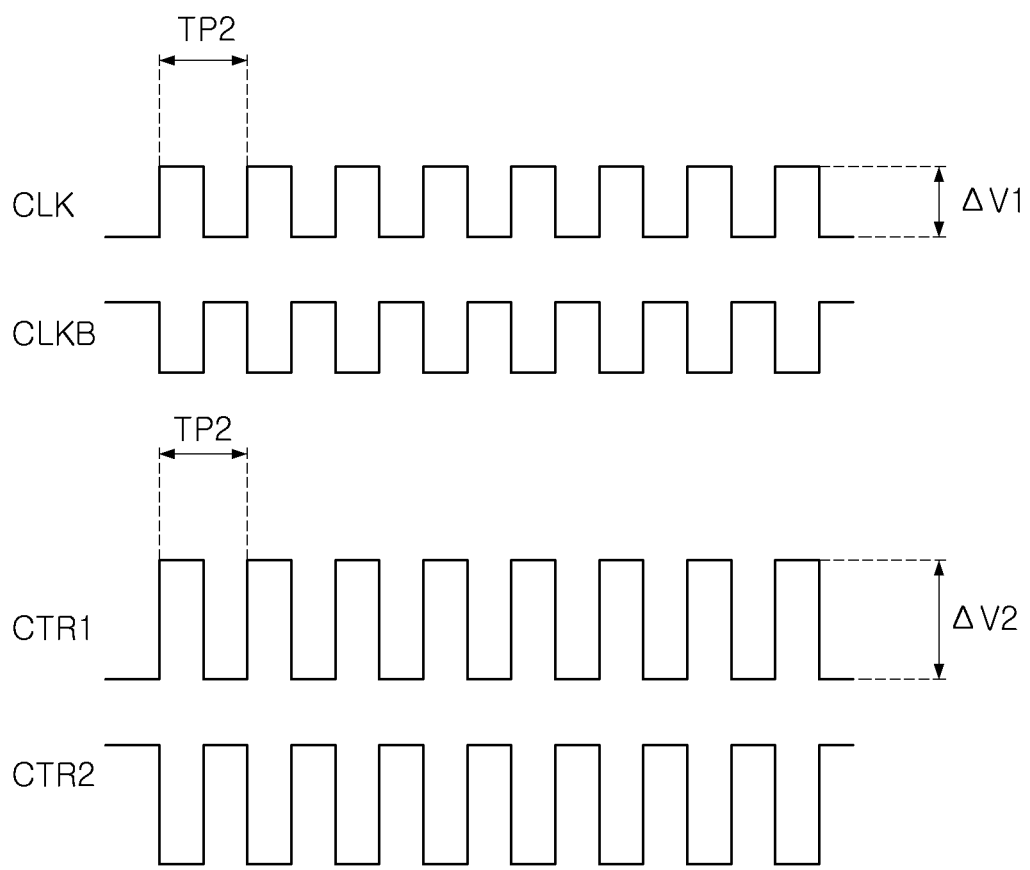

FIGS. 10A and 10B are schematic diagrams illustrating a semiconductor device according to example embodiments. FIGS. 11 and 12 are diagrams illustrating operations of a semiconductor device according to example embodiments.

Referring to FIG. 10A, a semiconductor device 400 according to an example embodiment may include a temperature compensation circuit 410, a voltage regulator 420, a clock generator 430, a level shifter 440, a charge pump 450, and the like. In some embodiments, the charge pump 450 may include the level shifter 440. The charge pump 450 may generate a voltage used for an operation of an internal circuit included in the semiconductor device 400. As an example, when the semiconductor device 400 is a memory device including a plurality of memory cells, the charge pump 450 may generate a program voltage required for a program operation to store data in memory cells, a read voltage required for a read operation to read data from the memory cells, an erasing voltage required for an erase operation to erase data stored in the memory cells, and the like.

The configuration and operation of the temperature compensation circuit 410 may be similar to those described above with reference to FIG. 7. Referring to FIG. 10A, the temperature compensation circuit 410 may include an operational amplifier 415, a plurality of transistors PM1 to PM3, a resistance element R, and a plurality of diodes D1 and D2, and may output a compensation current $I_{COMP}$ increased in proportion to the temperature. According to other example embodiments, the temperature compensation circuit 410 may output the compensation current $I_{COMP}$ decreased in proportion to the temperature.

The compensation current $I_{COMP}$ may be provided to each of the voltage regulator 420 and the clock generator 430. The voltage regulator 420 may include an operational amplifier 425, a plurality of transistors NM1 to NM3 and PM4, and a plurality of resistance elements R1 to R3, and the compensation current $I_{COMP}$ may be mirrored by a current mirror circuit, provided by the first transistor NM1 and the second transistor NM2, to flow through the plurality of resistance elements R1 to R3. Accordingly, a level of the pump voltage $V_{PUMP}$ output from the voltage regulator 420 may vary based on the compensation current $I_{COMP}$.

The clock generator 430 may include a first oscillator 431 generating a reference clock signal $CLK_{BS}$, a second oscillator 432 generating a first clock signal CLK and a second clock signal CLKB, a reference voltage generator 433, and the like. A frequency of the reference clock signal $CLK_{BS}$ may be determined by a reference voltage output from the reference voltage generator 433.

On the other hand, frequencies of the first clock signal CLK and the second clock signal CLKB may vary based on the compensation current Icon, other than the reference voltage. As an example, when the magnitude of the compensation current $I_{COMP}$ is increased, the frequencies of the first clock signal CLK and the second clock signal CLKB may be increased. The level shifter 440 may receive the first clock signal CLK, the second clock signal CLKB, and the pump voltage $V_{PUMP}$. As an example, a level of the pump voltage $V_{PUMP}$ may be higher than a swing level of each of the first clock signal CLK and the second clock signal CLKB. The level shifter 440 may generate a first control signal CTR1 increased a swing level of the first control signal CTR1, and generate a second control signal CTR2 increased a swing level of the second control signal CTR2 using the pump voltage $V_{PUMP}$. For example, frequencies of the first control signal CTR1 and the second control signal CTR2 may be increased when the frequencies of the first clock signal CLK and the second clock signal CLKB are increased. The swing level of each of the first control signal CTR1 and the second control signal CTR2 may be increased when the pump voltage $V_{PUMP}$ has a higher level than a swing level of each of the first clock signal CLK and the second clock signal CLKB.

As an example, the first control signal CTR1 may have the same phase and the same frequency as the first clock signal CLK and may have a swing level higher than a swing level of the first clock signal CLK. The second control signal CTR2 may have the same phase and the same frequency as the second clock signal CLKB and may have a swing level higher than a swing level of the second clock signal CLKB.

The first control signal CTR1 and the second control signal CTR2 may be input to the charge pump 450. As described above, the charge pump 450 may include a plurality of unit circuits, and each of the plurality of unit circuits may include a plurality of pumping capacitors. Among the plurality of pumping capacitors, some pumping capacitors may be charged and discharged by the first control signal CTR1, and the other pumping capacitors may be charged and discharged by the second control signal CTR2.

In summary, the frequency and swing level of each of the first control signal CTR1 and the second control signal CTR2 may vary based on the compensation current $I_{COMP}$. As a result, the frequency and swing level of each of the first control signal CTR1 and the second control signal CTR2 may be adjusted based on the temperature. As an example, the frequency and the swing level of each of the first control signal CTR1 and the second control signal CTR2 may be increased as the temperature is increased. Accordingly, the plurality of pumping capacitors included in the charge pump 450 are charged and discharged with signals swinging faster and wider, so that a level of a voltage output by the charge pump 450 may be increased as the temperature is increased.

In an example embodiment, the level of the voltage output by the charge pump 450 may vary based on temperature using the temperature compensation circuit 410, the voltage regulator 420, the clock generator 430, and the like. Accordingly, even with a low-capacity pumping capacitor, the charge pump 450 may sufficiently supply a voltage used for an operation of the semiconductor device 400 in a high-temperature environment in which the internal and/or ambient temperature of the semiconductor device 400 is high. As a result, a circuit area of the charge pump 450 may be reduced to improve the degree of integration of the semiconductor device. In addition, the charge pump outputs a relatively low-level voltage when the temperature is lower than or equal to room temperature and outputs a relatively high-level voltage only when the temperature is high, so that reliability of the semiconductor device 400 may be improved, irrespective of the temperature.

A semiconductor device 400A according to an example embodiment illustrated in FIG. may further include a first detection circuit 460 and a second detection circuit 470. For example, the first detection circuit 460 may compare a positive voltage VP output from a positive charge pump 451, with a first reference voltage (Vref1). The second detection circuit may compare a negative voltage VN output from a negative charge pump 452, with a second reference voltage (Vref2). As illustrated in FIG. 10B, outputs of the first detection circuit 460 and the second detection circuit 470 may be input to a clock generator 430.

The clock generator 430 may determine whether to maintain or stop outputting of the clock signals CLK and CLKB, based on outputs of the first and second detection circuits 460 and 470. As an example, when the positive charge pump 451 is outputting a voltage having a significantly high level, the first detection circuit 460 may determine that the positive voltage is higher than the first reference voltage. In this case, the clock generator 430 may stop outputting the clock signals CLK and CLKB to temporarily stop the operation of the positive charge pump 451, and may decrease a level of an output voltage of the positive charge pump 451 to be lower than the level of the first reference voltage.

Similarly, when the negative charge pump 452 is outputting a voltage having a significantly low level, the second detection circuit 470 may determine that the negative voltage is lower than the second reference voltage. For example, this may correspond to a case in which an absolute value of the negative voltage is greater than an absolute value of the second reference voltage. In this case, the clock generator 430 may stop outputting the clock signals CLK and CLKB to temporarily stop the operation of the negative charge pump 452, and may increase a level of an output voltage of the negative charge pump 452 to be higher than the level of the second reference voltage.

FIGS. 11 and 12 are schematic diagrams illustrating first and second clock signals CLK and CLKB and first and second control signals CTR1 and CTR2 generated by the semiconductor device 400. As an example, FIG. 11 is a diagram illustrating first and second clock signals CLK and CLKB and first and second control signals CTR1 and CTR2 generated in the semiconductor device 400 when internal and/or ambient temperature of the semiconductor device 400 is a first temperature. FIG. 12 is a diagram illustrating first and second clock signals CLK and CLKB and first and second control signals CTR1 and CTR2 generated in the semiconductor device 400 when internal and/or ambient temperature of the semiconductor device 400 is a second temperature higher than the first temperature.

Referring to FIG. 11, when the internal temperature of the semiconductor device 400 is the first temperature, the clock generator 430 may generate the first clock signal CLK and the second clock signal CLKB each having a first period TP1. The first clock signal CLK and the second clock signal CLKB may have opposite phases and may swing by a first swing level $\Delta V1$.

The first temperature may not be significantly outside of room temperature, or may be lower than room temperature. In this case, the magnitude of the compensation current Icon output from the temperature compensation circuit 410 may be scarcely changed, and thus a level of the pump voltage $V_{PUMP}$ output from the voltage regulator 420 may not be significantly different from the reference level. For example, the first control signal CTR1 and the second control signal CTR2 output from the level shifter 440 may swing at the same first swing level $\Delta V1$ as the first clock signal CLK and the second clock signal CLKB.

On the other hand, the second temperature may be a significantly high temperature, as compared with room temperature. For example, when the internal and/or ambient temperature of the semiconductor device 400 is increased to the second temperature, the magnitude of the compensation current $I_{COMP}$ output by the temperature compensation circuit 410 may be increased, and thus, a level of the pump voltage $V_{PUMP}$ may also be increased. For example, a period of each of the first clock signal CLK and the second clock signal CLKB may be set to a second period TP2 shorter than the first period TP1, by the second oscillator 432 generating the first clock signal CLK and the second clock signal CLKB based on the compensation current $I_{COMP}$. However, even at the second temperature, the swing levels of the first and second clock signals CLK and CLKB output from the clock generator 430 may be maintained at the first swing level $\Delta V1$.

In addition, the level shifter 440 may increase the swing level of each of the first control signal CTR1 and the second control signal CTR2 to a second swing level $\Delta V2$ using the pump voltage $V_{PUMP}$ having a level increased at the second temperature. As described above, in an example embodiment, the frequencies and the swing levels of the control signals CTR1 and CTR2 charging and discharging the pumping capacitors included in the charge pump 450 according to the internal and/or ambient temperature of the semiconductor device 400 may be dynamically adjusted. Accordingly, the voltage used for the operation of the semiconductor device 400 is supplied at a sufficient level in a high-temperature operating environment in which an effect of leakage current is increased, and a voltage may be adjusted and supplied at a used level in an operating environment of room temperature or lower. Therefore, both performance and reliability of the semiconductor device 400 may be improved.

When the internal and/or ambient temperature of the semiconductor device 400 is increased, swing levels of the control signals CTR1 and CTR2 may be adjusted by the level shifter 440. The level shifter may be disposed as close to the charge pump 450 as possible within the semiconductor device 400 to significantly reduce an effect of voltage drop, occurring in a voltage transmission path between the level shifter 440 and the charge pump 450, on the swing levels of the control signals CTR1 and CTR2. As an example, the level shifter 440 may be disposed to be closer to the charge pump 450 than the clock generator 430 and/or the voltage regulator 420.

Figure 13:
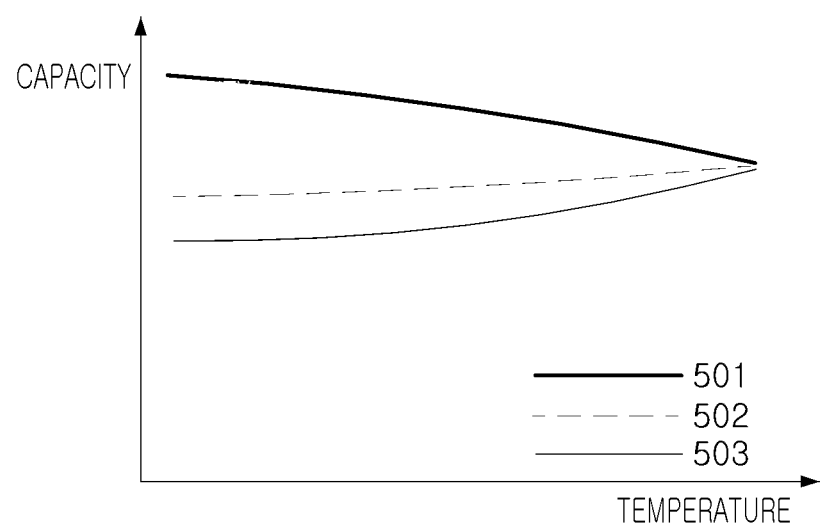
FIGS. 13 to 15 are diagrams illustrating operations of a semiconductor device according to example embodiments.
Figure 14:
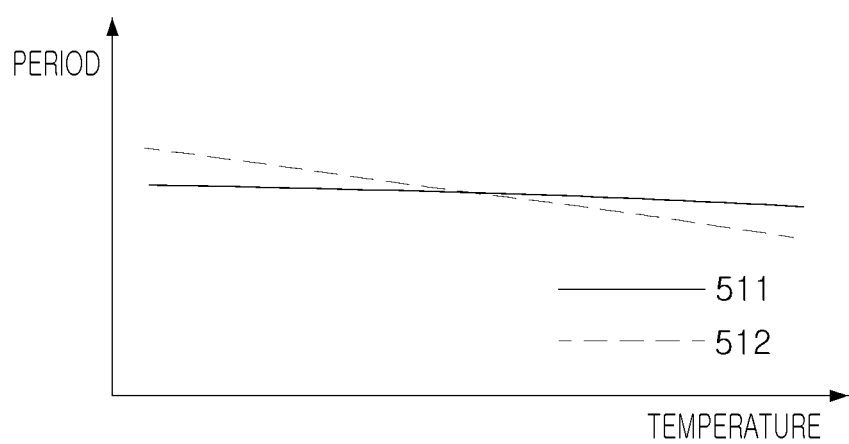
Figure 15:
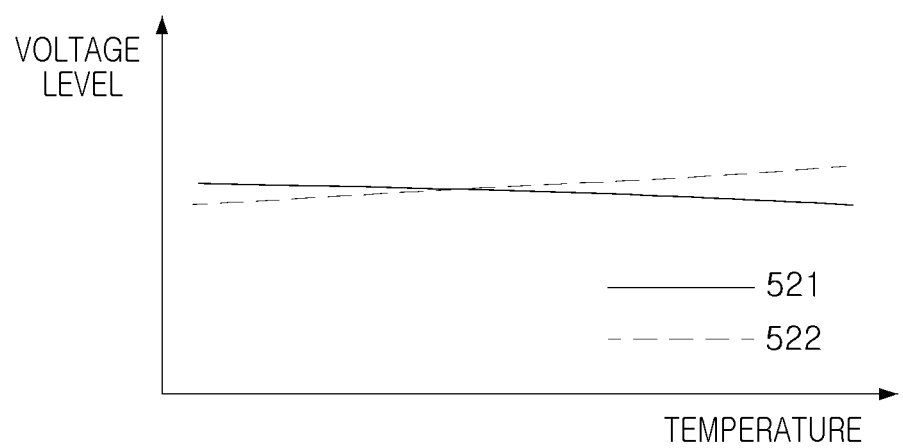

FIGS. 13 to 15 are diagrams illustrating operations of a semiconductor device according to example embodiments.

FIG. 13 is a diagram illustrating a change in capacity of a charge pump based on a change in the temperature. As an example, in FIG. 13, a horizontal axis corresponds to the temperature and a vertical axis corresponds to the capacity of the charge pump. The capacity corresponds to the amount of electrical charges supplied to an internal circuit of the semiconductor device by the charge pump, and thus may represent a level of an output voltage of the charge pump.

In the example embodiment illustrated in FIG. 13, a first graph 501 represents the amount of electrical charges supplied from the charge pump based on the temperature in a general semiconductor device, and a second graph 502 may represent the amount of electrical charges supplied from the charge pump based on the temperature in the semiconductor device according to the example embodiment. A third graph 503 may schematically illustrate an effect of leakage current, appearing in the semiconductor device, based on the temperature. As illustrated in the third graph 503, the effect of the leakage current may be increased as the temperature is increased.

As illustrated in the first graph 501, in a general semiconductor device, a charge pump may be designed to supply a large amount of charges at relatively low temperature. Accordingly, the charge pump may need to supply the amount of charges used in a high-temperature operating environment in which an effect of leakage current is increased. However, in the design illustrated in the first graph 501, the charge pump may supply an unnecessarily large amount of charges in an operating environment of room temperature and/or temperature lower than room temperature. As a result, an internal circuit supplied with a voltage of the charge pump to operate may receive a high-level voltage higher than a level used for operation. Thus, reliability of the semiconductor device may be deteriorated.

On the other hand, in an example embodiment, frequencies and swing levels of control signals charging and discharging pumping capacitors of a charge pump may be adjusted based on the temperature. As an example, the frequencies and swing levels of the control signals may be increased as the temperature is increased. Accordingly, as illustrated in the second graph 502, the charge pump may output a low-level voltage in an operating environment of room temperature and/or a temperature lower than room temperature, and may output a high-level voltage in a high-temperature operating environment.

As a result, in an example embodiment, the charge pump may appropriately supply a voltage having a level used for the operation of the internal circuit based on the internal and/or ambient temperature of the semiconductor device, so that both performance and reliability of the semiconductor device may be improved. In addition, capacity of each of the pumping capacitors included in the charge pump may be reduced, so that a circuit area occupied by the charge pump may be reduced to improve the degree of integration of the semiconductor device.

In an example embodiment, the charge pump may be designed to output a constant output voltage when temperature falls within a predetermined reference range. The reference range may be set to include room temperature, for example, 25 degrees Celsius. While the temperature falls within the reference range, the frequency and swing level of each of the control signals input to the charge pump may not be changed and may be constant.

As described above, the charge pump may receive control signals from the level shifter, and the level shifter may generate control signals by boosting the swing level of the clock signals, output from the clock generator, using the pump voltage output from the voltage regulator. However, when the temperature fails within the reference range, the level shifter may not adjust the swing level of the clock signals. In addition, when the temperature is changed within the reference range, the clock generator may maintain the frequency of the clock signals to be constant. As a result, the control signals may be the same as the clock signals. When the clock signals include first and second clock signals having opposite phases, the first control signal may be the same as the first clock signal and the second control signal may be the same as the second clock signal while the temperature fails within the reference range.

FIG. 14 is a diagram illustrating a period of a clock signal output from a clock generator of a semiconductor device according to an example embodiment, based on the temperature. FIG. is a diagram illustrating a level of a pump voltage output from a voltage regulator of a semiconductor device according to an example embodiment, based on the temperature. In each of FIGS. 14 and 15, first graphs 511 and 521 represent a period of a clock signal and a level of a pump voltage, respectively, in a general semiconductor device, and second graphs 512 and 522 represent a period of a clock signal and a level of a pump voltage in a semiconductor device according to example embodiments.

Referring to FIG. 14, unlike a general semiconductor device in which a period of a clock signal is maintained to be constant irrespective of temperature, in the semiconductor device according to an example embodiment, a period of a clock signal may be decreased as the temperature is increased. In an example embodiment, a period of a control signal charging and discharging pumping capacitors included in a charge pump may also be decreased as the temperature is increased, similarly to the clock signal. Accordingly, when the temperature is increased, the pumping capacitors may be charged and discharged more rapidly in the charge pump to increase a level of a voltage output from the charge pump.

Referring to FIG. 15, unlike a general semiconductor device in which a level of a pump voltage is maintained to be constant irrespective of temperature, in the semiconductor device according to an example embodiment, a level of a pump voltage may be increased as the temperature is increased. As described above, the pump voltage (e.g., $V_{PUMP}$) may be transmitted to a level shifter and may be used to adjust a swing level of a clock signal.

In an example embodiment, a swing level of a control signal charging and discharging pumping capacitors included in the charge pump may be increased by the pump voltage as temperature is increased. Accordingly, when the temperature is increased, the pumping capacitors may be charged and discharged by the control signal having a higher swing level in the charge pump, so that a level of a voltage output by the charge pump may be increased.

Figure 16:
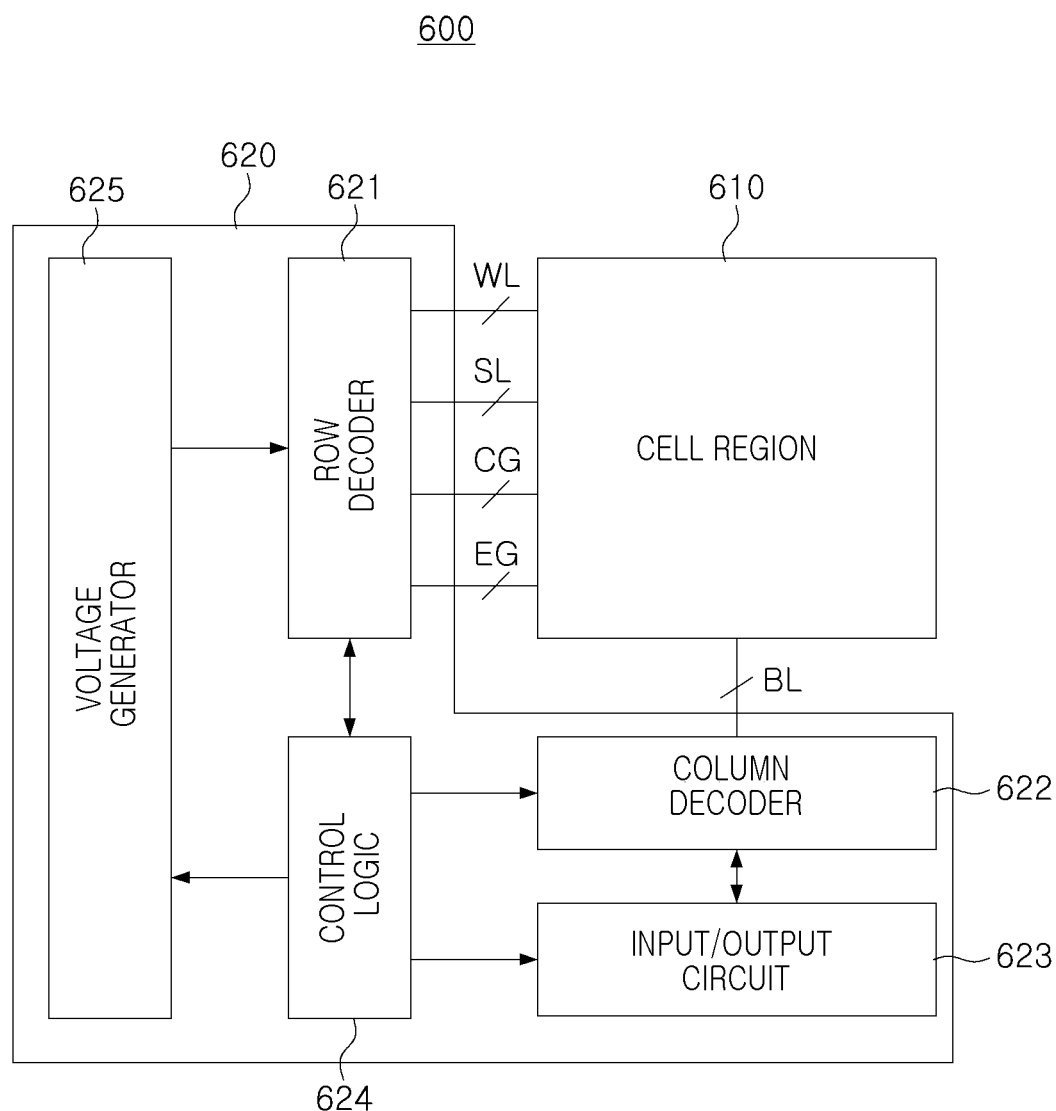
FIG. 16 is a schematic diagram illustrating a semiconductor device according to an example embodiment.

FIG. 16 is a schematic diagram illustrating a semiconductor device according to an example embodiment.

Referring to FIG. 16, a semiconductor device 600 according to an example embodiment may be a memory device storing data and outputting the stored data. As an example, the semiconductor device 600 according to an example embodiment may be a flash memory device mounted in an embedded system or the like.

The semiconductor device 600 may include a cell region 610 and a peripheral circuit region 620, and a plurality of memory cells may be disposed in the cell region 610 in the form of a memory cell array. The peripheral circuit region 620 may be connected to the cell region 610 through a plurality of wordlines WL, a plurality of source lines SL, a plurality of coupling gate lines CG, a plurality of erase gate lines EG, and a plurality of bitlines BL. The peripheral circuit region 620 may perform a program operation to store data in the plurality of memory cells, a read operation to read the data stored in the plurality of memory cells, an erase operation to erase the data stored in the plurality of memory cells, and the like.

The peripheral circuit region 620 may include a row decoder 621, a column decoder 622, an input/output circuit 623, a control logic 624, a voltage generator 625, and the like. The row decoder 621 may be connected to the plurality of memory cells through the plurality of wordlines WL, the plurality of source lines SL, the plurality of coupling gate lines CG, the plurality of erase gate lines EG, and the like. The row decoder 621 may select at least one of the plurality of wordlines WL, the plurality of source lines SL, the plurality of coupling gate lines CG, and the plurality of erase gate lines EG in response to the control of the control logic 624 to determine at least one of the plurality of memory cells.

The column decoder 622 may be connected to the plurality of memory cells through the plurality of bitlines BL and may determine at least one selected bitline, among the plurality of bitlines BL. As an example, the input/output circuit 623 may apply a bias voltage, used for a program operation or an erase operation, to the selected bitline, or may read data stored in the selected memory cell through the selected bitline in a read operation. Operations of the column decoder 622 and the input/output circuit 623 may be controlled by the control logic 624.

The voltage generator 625 may generate voltages having various levels used for the operation of the semiconductor device 600. As an example, the voltage generator 625 may generate a plurality of voltages applied to the plurality of wordlines WL, the plurality of source lines SL, the plurality of coupling gate lines CG, and the plurality of erase gate lines EG by the row decoder 621 in a program operation, a read operation, and an erase operation.

In the program operation, a program voltage may be input to the coupling gate CG connected to a selected memory cell, among the plurality of memory cells, and may have a level higher than a level of an external power supply voltage supplied to the semiconductor device 600 from an external host. In the erase operation, an erase voltage may be input to the erase gate EG connected to the selected memory cell and may be a negative voltage having a level lower than the level the external power supply voltage. Accordingly, the voltage generator 625 needs to generate both a positive voltage higher than the external power supply voltage, and a negative voltage lower than the external power supply voltage. For example, the negative voltage may be lower than the ground voltage.

In an example embodiment, the voltage generator 625 may be implemented according to one of the above-described embodiments. For example, the voltage generator 625 may include a charge pump adjusting a level of the external power supply voltage to generate a positive voltage and a negative voltage used for the operation of the semiconductor device 600.

The voltage generator 625 may further include the temperature compensation circuit, a voltage regulator, a clock generator, and the like, as described above with reference to FIGS. 1, 2, 7 to 9, and 10A, other than the charge pump. The temperature compensation circuit may output a compensation current having a magnitude varying based on internal and/or ambient temperature of the semiconductor device 600, and a level of the pump voltage output from the voltage regulator and a frequency of the clock signal output from the clock generator may vary based on the magnitude of the compensation current. Accordingly, the level of the voltage output from the charge pump may vary based on the temperature. As an example, when the semiconductor device 600 operates in a high-temperature environment, an absolute value of each of the positive voltage and the negative voltage may be increased more than in an operating environment of room temperature or lower.

Also, the voltage generator 625 may include detection circuits, respectively comparing the positive voltage and the negative voltage with a first reference voltage and a second reference voltage, as described above with reference to FIG. 10B. The operation of the charge pump may be temporarily stopped based on an output of the detection circuits. For example, when a level of the positive voltage supplied to the row decoder 621 from the charge pump of the voltage generator 625 is significantly high, the peripheral circuit region 620 may temporarily stop the operation of the clock generator outputting a clock signal to the charge pump.

Figure 17:
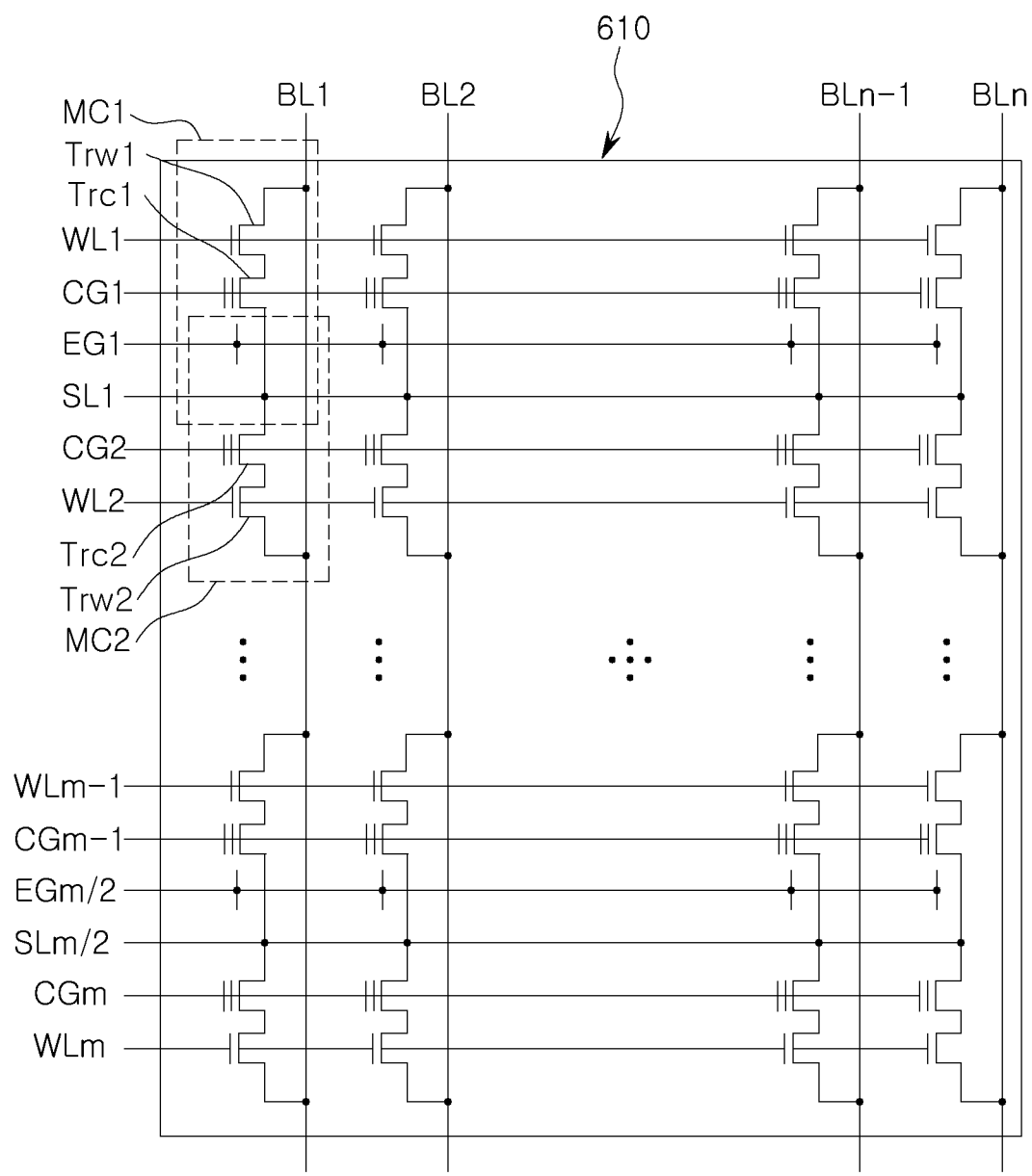
FIG. 17 is a schematic circuit diagram illustrating a cell region included in a semiconductor device according to an example embodiment.
Figure 18:
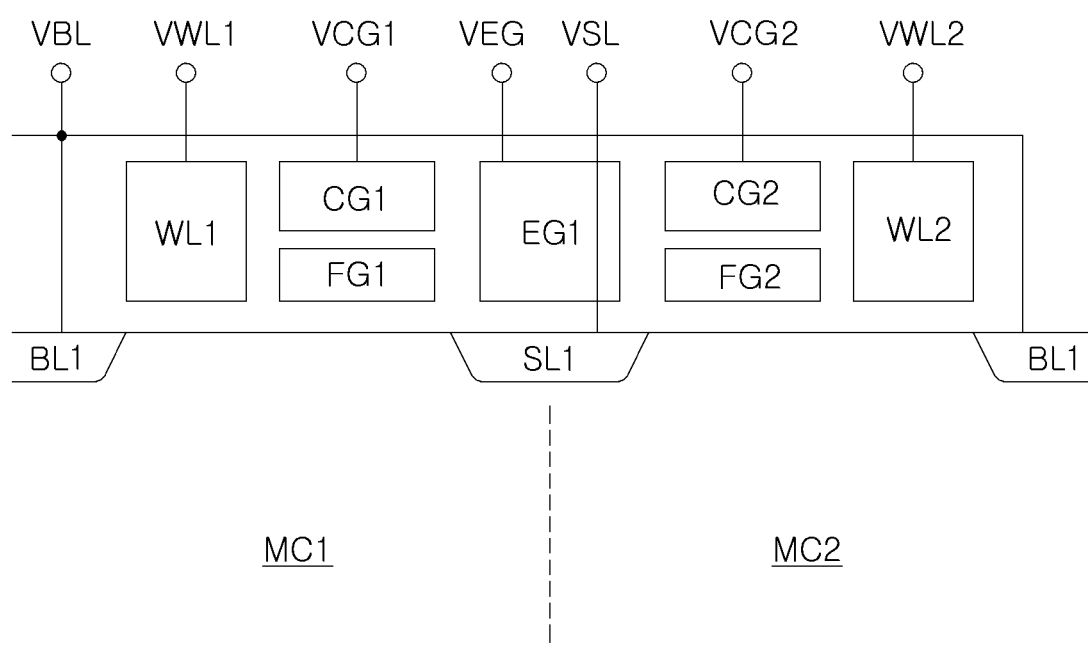
FIGS. 18 and 19 are diagrams illustrating operations of memory cells included in a cell region of a semiconductor device according to example embodiments.
Figure 19:
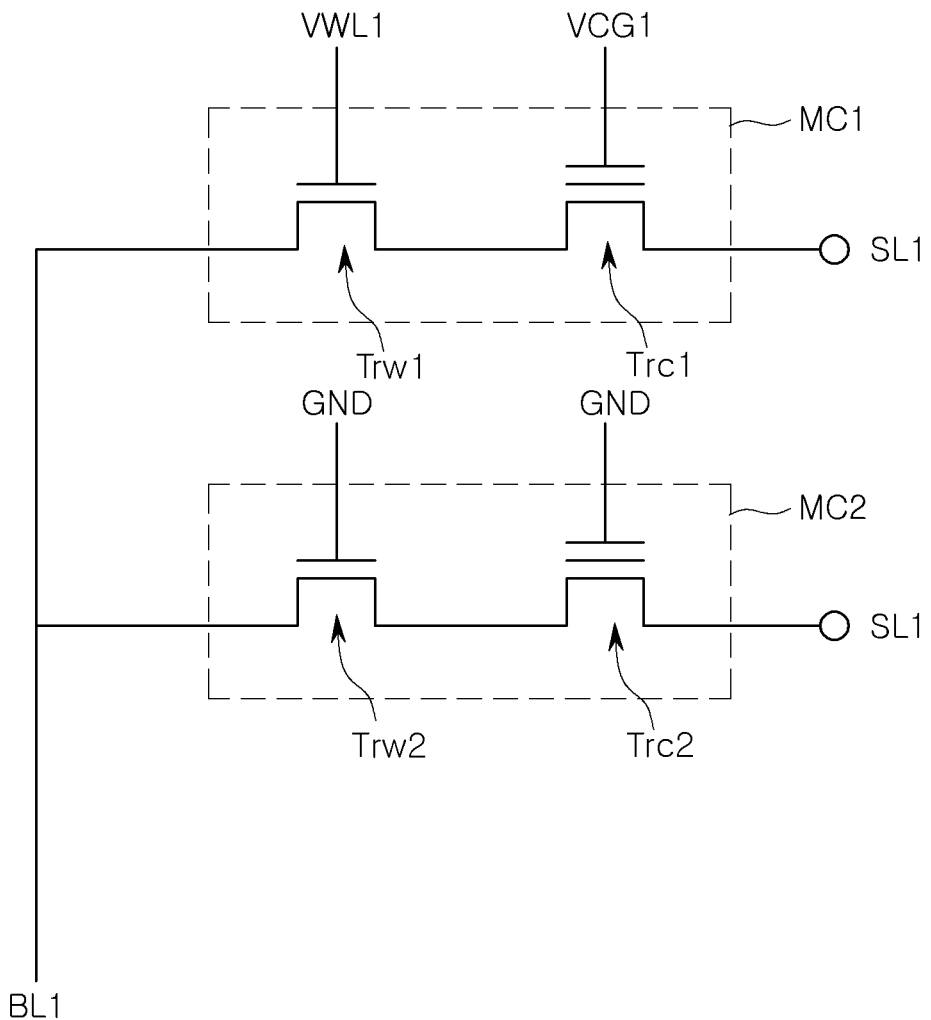

FIG. 17 is a schematic circuit diagram illustrating a cell region included in a semiconductor device according to an example embodiment. FIGS. 18 and 19 are diagrams illustrating operations of memory cells included in a cell region of a semiconductor device according to example embodiments.

FIG. 17 is a schematic circuit diagram illustrating a cell region 610 included in the semiconductor device 600 described with reference to FIG. 16. Referring to FIG. 17, the cell region 610 may include a plurality of memory cells, and the plurality of memory cells may be connected to a plurality of word lines WL1 to WLm, a plurality of source lines SL1 to SLm/2, a plurality of coupling gate lines CG1 to CGm, and a plurality of erase gate lines EG1 to EGm/2, and a plurality of bit lines BL1 to BLn. Each of the plurality of memory cells may be a NOR flash cell.

Referring to the first memory cell MC1 and the second memory cell MC2 illustrated in FIG. 17, some memory cells adjacent to each other may share one of the plurality of erase gate lines EG1 to EGm and one of the plurality of source lines SL1 to SLm/2. Accordingly, as illustrated in FIG. 17, the number of the plurality of erase gate lines EG1 to EGm/2 and the number of the plurality of source lines SL1 to SLm/2 may be smaller than the number of the plurality of wordlines WL1 to WLm and the number of the plurality of coupling gate lines CG1 to CGm.

Hereinafter, structures and operations of the memory cells MC1 and MC2 will be described with reference to FIGS. 17 to 19 together. Referring to the first memory cell MC1 illustrated in FIGS. 17 and 18, a first wordline transistor Trw1 may be connected between the first bitline BL1 and a first cell transistor Trc1. As an example, when a voltage (e.g., VWL1) input to the first wordline WL1 is higher than a threshold voltage of the first wordline transistor Trw1, a channel region may be formed in the first wordline transistor Trw1.

The first cell transistor Trc1 may be disposed between the first wordline transistor Trw1 and the first erase gate line EG1. A gate of the first cell transistor Trc1 may be provided by a first coupling gate line CG1, and the first cell transistor Trc1 may further include a first floating gate FG1 disposed between a semiconductor substrate and the first coupling gate line CG1.

As an example, in a program operation on the first memory cell MC1, electrical charges may be injected into to the first floating gate FG1 of the first cell transistor Trc1 and a threshold voltage of the first cell transistor Trc1 may be changed by a program voltage (e.g., VCG1) input to the first coupling gate line CG1. The program voltage input to the first coupling gate line CG1 may be a positive voltage output from the positive charge pump of the above-described voltage generator, and may have a level higher than a level of the external power supply voltage (e.g., VCC) supplied to the semiconductor device 600. In this case, a ground voltage GND may be input to a second coupling gate line CG2 and a second wordline WL2 connected to a second wordline transistor Trw2 and a second cell transistor Trc2, respectively.

The second memory cell MC2 may include the second wordline transistor Trw2 and the second cell transistor Trc2. The second wordline transistor Trw2 may be connected between the first bitline BL1 and the second cell transistor Trc2, and the second cell transistor Trc2 may be connected between the first source line SL1 and the second wordline transistor Trw2. For example, the first erase gate line EG1 and the first source line SL1 may be disposed between the first cell transistor Trc1 of the first memory cell MC1 and the second cell transistor Trc2 of the second memory cell MC2.

In a program operation on the second memory cell MC2, a program voltage may be input to the second coupling gate line CG2. When a program voltage is input to the second coupling gate line CG2, electrical charges may be injected into the second floating gate FG2 disposed between the second coupling gate line CG2 and the semiconductor substrate and a threshold voltage of the second cell transistor Trc2 may be changed. In this case, a ground voltage GND may be input to the first coupling gate line CG1 and the first wordline WL1 connected to the first wordline transistor Trw1 and the first cell transistor Trc1, respectively.

In an erase operation on the first memory cell MC1, a negative voltage may be input to the first coupling gate CG1. Accordingly, electrical charges injected into the floating gate of the first cell transistor Trc1 may move to the semiconductor substrate and the threshold voltage of the first cell transistor Trc1 may be changed. A negative voltage required for the erase operation may be generated from a negative charge pump included in the voltage generator.

A level of a voltage output from the charge pump of the voltage generator to perform a program operation, an erase operation, and the like, may be affected by internal and/or ambient temperature of the semiconductor device. In a high-temperature operating environment, leakage current may be increased in the semiconductor device. Therefore, when the charge pump outputs voltages having the same level, the program operation and the erase operation may not be smoothly performed. To ensure a stable operation of the semiconductor device in the high-temperature operating environment, the charge pump may be designed to output a voltage higher than the voltage used for program and erase operations, in an operating environment of room temperature or lower in consideration of the effect of leakage current. However, in this case, a reliability issue of the semiconductor device may occur.

In consideration of the foregoing, in an example embodiment, the charge pump may output voltages having different levels based on the internal and/or ambient temperature of the semiconductor device. As an example, the voltage generator includes a temperature compensation circuit outputting compensation current having a magnitude varying based temperature, a clock generator varying and outputting a frequency of a clock signal based on the compensation current, a voltage generator varying and outputting the level of the pump voltage based on the compensation current, and the like.

A frequency of a control signal charging and discharging the pumping capacitors of the charge pump may be determined based on the frequency of the clock signal, and a swing level of the control signal may be determined based on the pump voltage. As the internal and/or ambient temperature of the semiconductor device is increased, the frequency and swing level of the control signal input to the charge pump may be increased, so that the pumping capacitors may be rapidly charged and discharged. As a result, the level of the voltage output by the charge pump may be increased. Accordingly, the semiconductor device may stably operate in spite of an increase in effect of leakage current in a high-temperature operating environment. In addition, reliability in an operating environment of room temperature or lower may be sufficiently secured, and sizes of the pumping capacitors may be reduced to improve the degree of integration of the semiconductor device.

As described above, according to example embodiments, a charge pump may be designed to generate an output voltage having a higher level when internal and/or ambient temperature of a semiconductor device is increased, so that reliability of the semiconductor device may be improved in low-temperature and high-temperature conditions. In addition, a voltage used for operation of the semiconductor device may be sufficiently secured while implementing a charge pump with a pumping capacitor having relatively small capacity as compared capacity according to the related art, and a circuit area occupied by the charge pump may be reduced to improve the integration of the semiconductor device.

While example embodiments have been shown and described above, it will be apparent to those skilled in the art that modifications and variations could be made without departing from the scope of the present inventive concept as defined by the appended claims.

What is claimed is:
1. A semiconductor device comprising:
a plurality of memory cells; and
a peripheral circuit configured to control the plurality of memory cells,
wherein the peripheral circuit includes:
a temperature compensation circuit configured to output a compensation current determined based on a temperature of the semiconductor device,
a voltage regulator configured to regulate a pump voltage having a level determined based on the compensation current,
a clock generator configured to generate a clock signal having a frequency determined based on the compensation current, and
a charge pump circuit including:
a level shifter configured to output a control signal adjusted a swing level of the control signal based on the clock signal and the pump voltage, and
a plurality of unit circuits each including a plurality of pumping capacitors configured to be charged and discharged by the control signal.

2. The semiconductor device of claim 1, wherein the voltage regulator is configured to determine a level of the pump voltage as:
a first level when the temperature is a first temperature, and a second level higher than the first level when the temperature is a second temperature higher than the first temperature.

3. The semiconductor device of claim 1, wherein the clock generator is configured to determine a frequency of the clock signal as:
a first frequency when the temperature is a first temperature, and
a second frequency higher than the first frequency when the temperature is a second temperature higher than the first temperature.

4. The semiconductor device of claim 1, wherein the compensation current is proportional-to-absolute temperature (PTAT) current proportional to temperature.

5. The semiconductor device of claim 1, wherein the charge pump circuit includes:
a positive charge pump configured to output a positive voltage higher than a ground voltage, and
a negative charge pump configured to output a negative voltage lower than the ground voltage.

6. The semiconductor device of claim 5, wherein each of the plurality of memory cells is a NOR flash cell,
wherein the peripheral circuit further includes a row decoder connected to the plurality of memory cells through a plurality of wordlines, a plurality of coupling gate lines, and a plurality of erase gate lines, and
wherein the row decoder is configured to apply:
the positive voltage to a selected coupling gate line among the plurality of coupling gate lines, in a program operation, and
the negative voltage to a selected erase gate line among the plurality of erase gate lines, in an erase operation.

7. The semiconductor device of claim 5, wherein the plurality of unit circuits includes:
positive unit circuits included in the positive charge pump, and
negative unit circuits included in the negative charge pump, and
wherein the number of the positive unit circuits is equal to the number of the negative unit circuits.

8. The semiconductor device of claim 5, wherein the positive charge pump includes:
a first positive charge pump configured to output a first positive voltage, and
a second positive charge pump configured to output a second positive voltage having a level higher than a level of the first positive voltage, and
wherein the negative charge pump is configured to receive the second positive voltage.

9. The semiconductor device of claim 5, wherein the peripheral circuit further includes:
a first detection circuit configured to compare the positive voltage with a first reference voltage, and
a second detection circuit configured to compare the negative voltage with a second reference voltage, and
wherein the clock generator is configured to stop outputting the clock signal to:
the positive charge pump when the positive voltage is higher than the first reference voltage, and
the negative charge pump when the negative voltage is lower than the second reference voltage.

10. The semiconductor device of claim 1, wherein the clock generator is further configured to generate a reference clock signal having a constant frequency regardless of the temperature.

11. A semiconductor device comprising:
a temperature compensation circuit configured to output a proportional-to-absolute temperature (PTAT) current determined based on a temperature of the semiconductor device as a compensation current;
a voltage regulator configured to output a pump voltage having a level determined based on the compensation current;
a clock generator configured to generate a clock signal having a frequency determined based on the compensation current;
a level shifter configured to generate a control signal adjusted a swing level of the control signal based on the clock signal and the pump voltage; and
a charge pump including a plurality of unit circuits, each of the plurality of unit circuits including a plurality of pumping capacitors configured to be charged and discharged by the control signal,
wherein the level shifter is disposed to be closer to the charge pump than the clock generator.

12. The semiconductor device of claim 11, wherein the clock generator is configured to output a first clock signal and a second clock signal having opposite phases, and
wherein the level shifter is configured to amplify:
a voltage level of the first clock signal to output a first control signal, and
a voltage level of the second clock signal to output a second control signal.

13. The semiconductor device of claim 12, wherein each of the plurality of unit circuits includes first to third pumping capacitors,
wherein the first and third pumping capacitors included in a first unit circuit among the plurality of unit circuits are configured to be charged and discharged by the first control signal, and
wherein the second pumping capacitor included in the first unit circuit is configured to be charged and discharged by the second control signal.

14. The semiconductor device of claim 13, wherein the plurality of unit circuits include a second unit circuit connected to the first unit circuit in series,
wherein the first and third pumping capacitors included in the second unit circuit are configured to be charged and discharged by the second control signal, and
wherein the second pumping capacitor included in the second unit circuit is configured to be charged and discharged by the first control signal.

15. A semiconductor device comprising:
a level shifter configured to:
receive a first clock signal, a second clock signal having a phase opposite to a phase of the first clock signal, and a pump voltage,
output a first control signal and a second control signal based on the first and second clock signals and the pump voltage, and
adjust swing levels of the first and second control signals based on a level of the pump voltage; and
a charge pump including a plurality of unit circuits, each of the plurality of unit circuits including:
at least one first pumping capacitor configured to be charged and discharged by the first control signal, and
at least one second pumping capacitor configured to be charged and discharged by the second control signal,
wherein at least one of a frequency and a swing level of each of the first control signal and the second control signal is increased as a temperature of the semiconductor device is increased, and wherein the level of the pump voltage is determined based on the temperature.

16. The semiconductor device of claim 15, wherein the first control signal has the same frequency and the same phase as the first clock signal, and wherein the second control signal has the same frequency and the same phase as the second clock signal.

17. The semiconductor device of claim 15, wherein each of a first unit circuit and a second unit circuit of the plurality of unit circuits includes a plurality of first and second pumping capacitors, wherein the number of the first pumping capacitors included in the first unit circuit is greater than the number of the second pumping capacitors included in the first unit circuit, and wherein the number of the first pumping capacitors included in the second unit circuit is smaller than the number of the second pumping capacitors included in the second unit circuit.

18. The semiconductor device of claim 17, wherein the first unit circuit and the second unit circuit are connected to each other in series.

19. The semiconductor device of claim 15, wherein each of the first pumping capacitor and the second pumping capacitor is a metal oxide semiconductor (MOS) capacitor.

20. The semiconductor device of claim 15, wherein the first control signal is identical to the first clock signal and the second control signal is identical to the second clock signal when the temperature is within a predetermined reference range.

* * * * *